US010797102B2

(12) United States Patent
Chen et al.

(10) Patent No.: US 10,797,102 B2
(45) Date of Patent: Oct. 6, 2020

(54) CHIP-SCALE LINEAR LIGHT-EMITTING DEVICE

(71) Applicant: MAVEN OPTRONICS CO., LTD., Hsinchu County (TW)

(72) Inventors: Chieh Chen, Palo Alto, CA (US); Chia-Hsien Chang, New Taipei (TW)

(73) Assignee: Maven Optronics Co., Ltd., Hsinchu County (TW)

( * ) Notice: Subject to any disclaimer, the term of this patent is extended or adjusted under 35 U.S.C. 154(b) by 0 days.

(21) Appl. No.: 16/355,682

(22) Filed: Mar. 15, 2019

(65) Prior Publication Data

US 2019/0296077 A1     Sep. 26, 2019

(30) Foreign Application Priority Data

Mar. 23, 2018  (TW) .............................. 107110390 A
Mar. 26, 2018  (CN) ........................... 2018 1 0254467

(51) Int. Cl.
*H01L 27/15*     (2006.01)
*F21V 8/00*      (2006.01)
(Continued)

(52) U.S. Cl.
CPC .......... *H01L 27/156* (2013.01); *G02B 6/0026* (2013.01); *G02B 6/0073* (2013.01);
(Continued)

(58) Field of Classification Search
CPC ..... H01L 27/156; H01L 33/486; H01L 33/60; H01L 33/507; H01L 33/56;
(Continued)

(56) References Cited

U.S. PATENT DOCUMENTS 9,673,364 B2 * 6/2017 Nakabayashi ........ H01L 33/486
10,312,224 B2   6/2019 Edmond et al.
(Continued)

FOREIGN PATENT DOCUMENTS

CN    102800795 A    11/2012
CN    204026333 U    12/2014
(Continued)

OTHER PUBLICATIONS

Extended Search Report in corresponding European Patent Application No. 19162772.8, dated Jul. 4, 2019, 10 pages.
(Continued)

*Primary Examiner* — Alan B Cariaso
(74) *Attorney, Agent, or Firm* — Foley & Lardner LLP

(57) ABSTRACT

A chip-scale linear light-emitting device includes a submount substrate, light-emitting diode (LED) semiconductor chips, a chip-scale packaging structure and a reflective structure. The LED semiconductor chips, the packaging structure and the reflective structure are disposed on the submount substrate, wherein the packaging structure partially covers the chip-upper surface and/or the chip-edge surfaces of the LED semiconductor chips, and the reflective structure partially covers the package-top surface and/or the package-side surfaces of the packaging structure. If one of the chip-edge surfaces and the package-side surface of the packaging structure are exposed from the reflective structure as a primary light-emitting side surface, a side-view type linear light-emitting device is formed. If the package-top surface of the packaging structure is exposed from the reflective structure as a primary light-emitting top surface, a top-view type linear light-emitting device is formed. A substantially transparent light-transmitting material and/or a photoluminescent material can be configured to be included inside the packaging structure. In this configuration, a pri-
(Continued)

mary light emitted from the LED semiconductor chips is directed to pass through the packaging structure and radiated outward from the primary light-emitting surface. Therefore, a monochromatic light or a white light with a uniformly distributed linear radiation pattern can be generated using the chip-scale linear light-emitting device.

19 Claims, 51 Drawing Sheets

(51) Int. Cl.
*H01L 33/50* (2010.01)
*H01L 33/60* (2010.01)
*H01L 33/48* (2010.01)
*H01L 33/56* (2010.01)

(52) U.S. Cl.
CPC .......... *H01L 33/486* (2013.01); *H01L 33/507* (2013.01); *H01L 33/60* (2013.01); *G02B 6/0031* (2013.01); *H01L 33/56* (2013.01); *H01L 2933/0033* (2013.01); *H01L 2933/0058* (2013.01)

(58) Field of Classification Search
CPC .... H01L 2933/0058; H01L 2933/0033; G02B 6/0073; G02B 6/0023; G02B 6/0031; G02B 6/0026
See application file for complete search history.

(56) References Cited

U.S. PATENT DOCUMENTS

| | | |
|---|---|---|
| 2006/0262554 A1 | 11/2006 | Mok et al. |
| 2009/0152570 A1* | 6/2009 | Wang ............... H01L 24/97 257/88 |
| 2010/0127294 A1 | 5/2010 | Chen et al. |
| 2010/0171145 A1 | 7/2010 | Morgan et al. |
| 2013/0214300 A1 | 8/2013 | Lerman et al. |
| 2014/0177206 A1* | 6/2014 | Sheu ............... G02B 6/0023 362/97.1 |
| 2015/0085527 A1* | 3/2015 | Nam ............... H01L 33/505 362/612 |
| 2016/0313491 A1* | 10/2016 | Li ............... G09G 3/2003 |
| 2018/0047712 A1 | 2/2018 | Bang et al. |

FOREIGN PATENT DOCUMENTS

| | | |
|---|---|---|
| CN | 104300068 A | 1/2015 |
| CN | 104515040 A | 4/2015 |
| CN | 105304772 A | 2/2016 |
| EP | 2 216 834 A1 | 8/2010 |
| EP | 2 854 186 A1 | 4/2015 |
| TW | 201801284 A | 1/2018 |

OTHER PUBLICATIONS

Office Action and Search Report for corresponding Taiwan Patent Application No. 107110390, dated Jun. 25, 2019, 4 pages.

\* cited by examiner

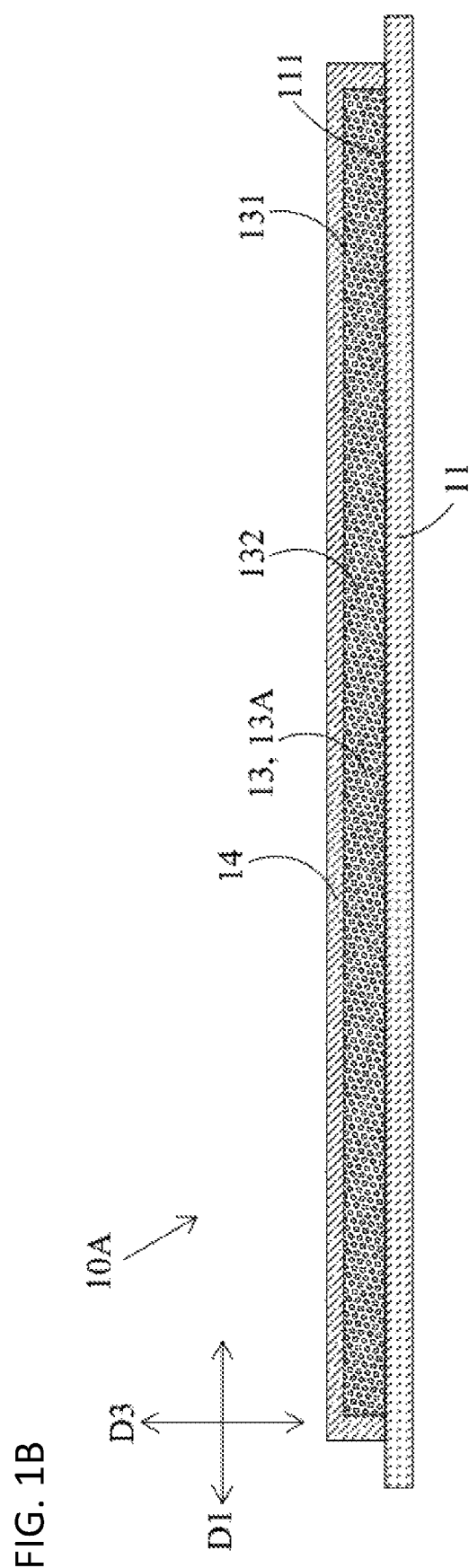

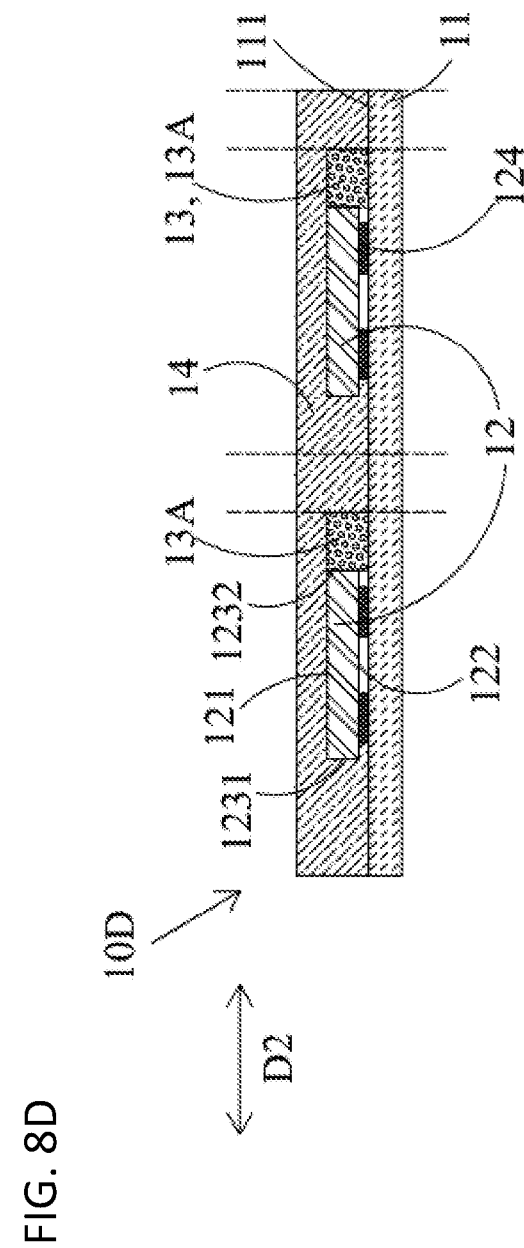

CHIP-SCALE LINEAR LIGHT-EMITTING DEVICE

CROSS-REFERENCE TO RELATED APPLICATIONS

This application claims the benefit of and priority to Taiwan Patent Application No. 107110390 filed on Mar. 23, 2018, and Chinese Patent Application No. 201810254467.7 filed on Mar. 26, 2018, the disclosures of which are incorporated herein by reference in their entirety.

BACKGROUND

Technical Field

The present disclosure relates to a light-emitting device, and more particularly to a chip-scale linear light-emitting device having a uniformly distributed linear radiation pattern.

Description of the Related Art

Light-emitting diodes (LEDs) have been used in an edge-lit type backlight module or a direct backlight module of a Liquid Crystal Display (LCD) for televisions and smart phones. An edge-lit backlight module generally includes a light guide plate and an LED light bar, wherein the LED light bar is disposed beside one side surface of the light guide plate (hereinafter referred to as a light-incident surface). The LED light bar can emit a light beam toward the light-incident surface of the light guide plate. Specifically, the LED light bar includes a linear submount substrate, such as a linear Printed Circuit Board (PCB), and a plurality of LEDs disposed on the submount substrate, wherein the LEDs are electrically connected to the submount substrate and maintained at a certain pitch distance from each other. Since the LEDs are non-continuously disposed on the submount substrate, the linear light bar has weaker light beam intensity between the LEDs. In other words, the light beam intensity provided by the LED light bar is not continuously and is not uniformly distributed along the length direction of the light bar. Therefore, dark regions or dark spots occur on the light guide plate. The dark regions affect the uniformity of the light intensity of the light guide plate.

In order to improve the dark areas of the light guide plate, a distance between the LED light bar and the border of an effective display area (e.g., a light mixing distance) should be sufficiently large. However, since a display of electronic products is designed toward a thinner and bevel-less display, the light mixing distance for the backlight module can be constrained. If the light mixing distance between the LED light bar and the edge of the effective display area is reduced, the dark areas of the light guide plate become more visible.

On the other hand, the thickness of the backlight module is specified to be increasingly thinner. For a thinner backlight module, if an LED semiconductor chip included in the LED light bar is a top-view structure (e.g., its main light-emitting surface and an electrode surface are disposed to be parallel to each other), the LED semiconductor chip should be disposed with an orientation so that the main light-emitting top surface of the top-view type LED semiconductor chip is facing the light-incident surface of the thin light guide plate. With this configuration, it is challenging to accurately align the miniaturized LED light bar module with the light-incident surface of the thin light guide plate, resulting in light leakage.

In view of this, an efficient solution to make an LED light bar maintain a small-size of the LED light bar with a linear and uniform light beam distribution when used in a thinner backlight module for a bevel-less display, and to improve the dark areas of a light guide plate, remains desired in the LED industry.

SUMMARY

One object of some embodiments of the present disclosure is to provide a chip-scale linear light-emitting device configured to emit light with a linearly and uniformly distributed light radiation pattern. Another object of some embodiments of the present disclosure is to effectively minimize or reduce occurrence of the dark regions on a light guide plate when the linear light-emitting device is used as a light source in a backlight module. Another object of some embodiments of the present disclosure is that a main light-emitting surface of the linear light-emitting device can be configured to be perpendicular to a set of electrodes of an LED semiconductor chip, so that the linear light-emitting device is a side-view type light-emitting device. Therefore, the side-view type linear light-emitting device and the light guide plate can be readily aligned in a backlight module to avoid light leakage.

In order to achieve the above object, a side-view type chip-scale linear light-emitting device comprises: a submount substrate, a plurality of flip-chip LED semiconductor chips disposed on the submount substrate, a chip-scale packaging structure, and a reflective structure. The submount substrate comprises a substrate-top surface, wherein a first horizontal direction and a second horizontal direction perpendicular to each other are specified on the substrate-top surface. The plurality of flip-chip LED semiconductor chips are disposed on the substrate-top surface of the submount substrate along the first horizontal direction, wherein each of the LED semiconductor chips includes a chip-upper surface, a chip-lower surface opposite to the chip-upper surface, a first chip-edge surface, a second chip-edge surface, and a set of electrodes. The first chip-edge surface and the second chip-edge surface are disposed substantially in parallel, opposite to or facing each other, and are spaced apart along the second horizontal direction, each of the chip-edge surfaces connects to the chip-upper surface and the chip-lower surface, and the set of electrodes is disposed on or adjacent to the chip-lower surface. The chip-scale packaging structure is disposed on the substrate-top surface of the submount substrate and covers the second chip-edge surfaces of the LED semiconductor chips, wherein the packaging structure includes a package-top surface and a main light-emitting side surface, the main light-emitting side surface and the second chip-edge surfaces of the LED semiconductor chips are disposed substantially in parallel along the second horizontal direction, are opposite to or facing one another, and are spaced apart from each other and substantially perpendicular to the electrodes of the LED semiconductor chips. The reflective structure is disposed on the substrate-top surface of the submount substrate, and covers the first chip-edge surfaces of the LED semiconductor chips, the chip-upper surfaces of the LED semiconductor chips, and the package-top surface of the chip-scale packaging structure; however, the second chip-edge surfaces of the LED semiconductor chips and the main light-emitting side surface of the chip-scale packaging structure are exposed from the reflective structure.

In order to achieve the above object, a backlight module according to some embodiments of the present disclosure comprises: the above disclosed side-view type chip-scale linear light-emitting device and a light guide plate. The light guide plate comprises a light-incident surface, a light-exiting surface, a light-guide-back surface and a reflective layer, wherein the light-incident surface is facing the main light-emitting side surface of the chip-scale linear light-emitting device, and connects the light-exiting surface and the light-guide-back surface. The reflective layer is disposed on the light-guide-back surface.

In order to achieve the above object, another top-view type chip-scale linear light-emitting device according to some embodiments of the present disclosure comprises: a submount substrate, a plurality of flip-chip LED semiconductor chips disposed on the submount substrate, a chip-scale packaging structure, and a reflective structure. The submount substrate comprises a substrate-top surface specifying a first horizontal direction, a second horizontal direction perpendicular to each other, and a normal direction. The plurality of flip-chip LED semiconductor chips are disposed on the substrate-top surface of the submount substrate along the first horizontal direction, wherein each of the LED semiconductor chips has a chip-upper surface, a chip-lower surface opposite to the chip-upper surface, a plurality of chip-edge surfaces and a set of electrodes. The chip-edge surfaces are connected to the chip-upper surface and the chip-lower surface, and the set of electrodes is disposed on or adjacent to the chip-lower surface. The chip-scale packaging structure is disposed on the substrate-top surface of the submount substrate, covering the chip-upper surfaces and/or the chip-edge surfaces of the LED semiconductor chips, wherein the chip-scale packaging structure includes a main light-emitting top surface and a plurality of package-side surfaces. The main light-emitting top surface, the chip-upper surfaces of the LED semiconductor chips, and the set of electrodes are disposed substantially in parallel along the normal direction, are opposite to or facing one another, and are spaced apart from one another. The reflective structure is disposed on the substrate-top surface of the submount substrate to cover the chip-edge surfaces of the LED semiconductor chips and the chip-scale packaging structure along the first horizontal direction and the second horizontal direction, but exposing the chip-upper surfaces of the LED semiconductor chips and the main light-emitting top surface of the chip-scale packaging structure.

In order to achieve the above object, a backlight module according to some embodiments of the present disclosure comprises: the above disclosed top-view type chip-scale linear light-emitting device and a light guide plate. The light guide plate comprises a light-incident surface, a light-exiting surface, a light-guide-back surface and a reflective layer, wherein the light-incident surface faces the main light-emitting top surface of the chip-scale linear light-emitting device, and is connected to the light-exiting surface and the light-guide-back surface. The reflective layer is disposed on the light-guide-back surface.

Thereby, a continuous linear light-mixing optical cavity between the reflective structure is formed such that the primary light generated from the LED semiconductor chips can be reflected by the reflective structure and directed toward a region between the LED semiconductor chips. Therefore, the main light-emitting side surface (or the main light-emitting top surface) can be uniformly irradiated to generate a uniform light beam having a linearly distributed light radiation pattern. When the linear light-emitting device is used in conjunction with a light guide plate to form a backlight module, the light beam having a linearly distributed light radiation pattern can be transmitted to the light-incident surface of the light guide plate more uniformly to reduce or improve the occurrence of the dark regions of the light-incident surface.

On the other hand, the linear light-emitting device can be a side-view type chip-scale linear light-emitting device that radiates a light beam from the main light-emitting side surface, and can be used for a side-view type backlight module, wherein the miniaturized LED light bar and the thin light guide plate can be accurately aligned to avoid light leakage.

Other aspects and embodiments of the disclosure are also contemplated. The foregoing summary and the following detailed description are not meant to restrict the disclosure to any particular embodiment but are merely meant to describe some embodiments of the disclosure.

BRIEF DESCRIPTION OF THE DRAWINGS

FIG. 1A and FIG. 1B are a side view and a front view of a chip-scale linear light-emitting device in accordance with a first embodiment of the present disclosure.

FIG. 6A, FIG. 6B, FIG. 6C, FIG. 6D, and FIG. 6E are schematic views showing the fabricating stages of the chip-scale linear light-emitting device shown in

FIG. 5A.

FIG. 8A, FIG. 8B, FIG. 8C, and FIG. 8D are schematic views showing the fabricating stages of the chip-scale linear light-emitting device shown in FIG. 7A.

DETAILED DESCRIPTION

Definitions

Figure 1A:
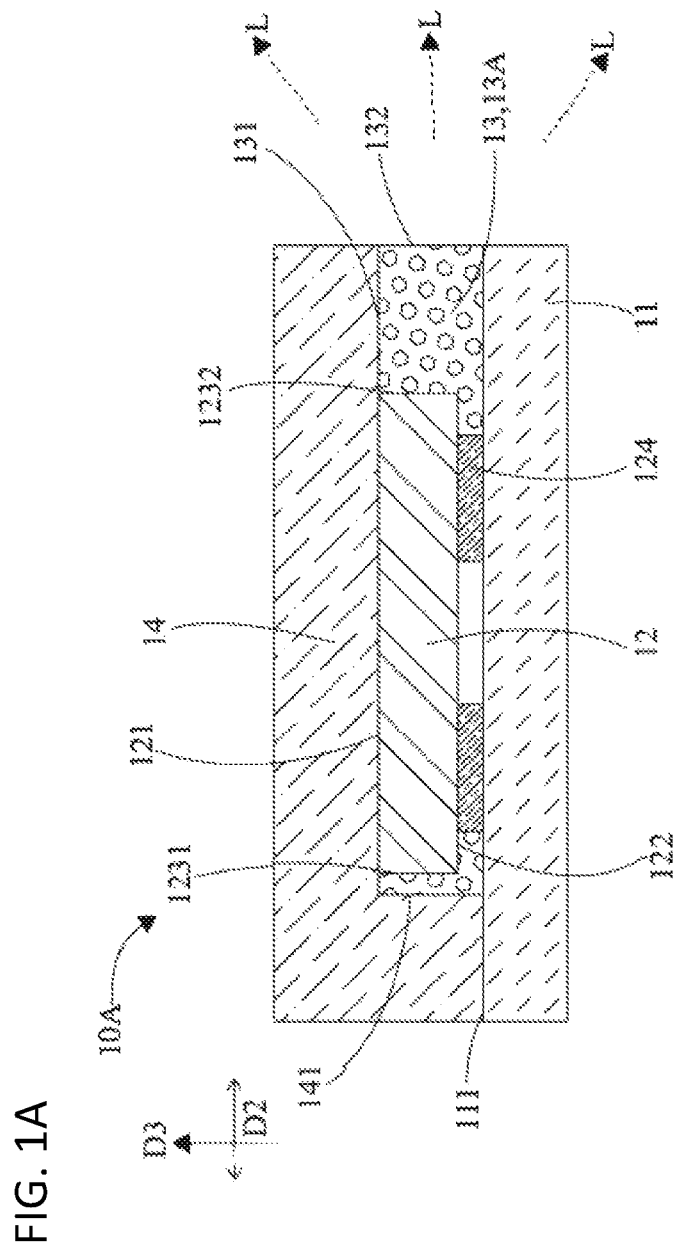

The following definitions apply to some of the technical aspects described with respect to some embodiments of the disclosure. These definitions may likewise be expanded upon herein.

As used herein, the singular terms "a," "an," and "the" may include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another. In the description of some embodiments, a component provided "on" or "on top of" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" transparent can refer to a light transmittance of at least 70%, such as at least 75%, at least 80%, at least 85% or at least 90%, over at least a portion or over an entirety of the visible spectrum. For example, "substantially" flush can refer to two surfaces within 20 micrometers of lying along a same plane, such as within 10 micrometers of lying along the same plane, or within 5 micrometers of lying along the same plane. For example, "substantially" in parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein with respect to photoluminescence, the term "efficiency" or "quantum efficiency" refers to a ratio of the number of output photons to the number of input photons.

As used herein, the term "size" refers to a characteristic dimension. In the case of an object (e.g., a particle) that is spherical, a size of the object can refer to a diameter of the object. In the case of an object that is non-spherical, a size of the non-spherical object can refer to a diameter of a corresponding spherical object, where the corresponding spherical object exhibits or has a particular set of derivable or measurable characteristics that are substantially the same as those of the non-spherical object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

Figure 1C:
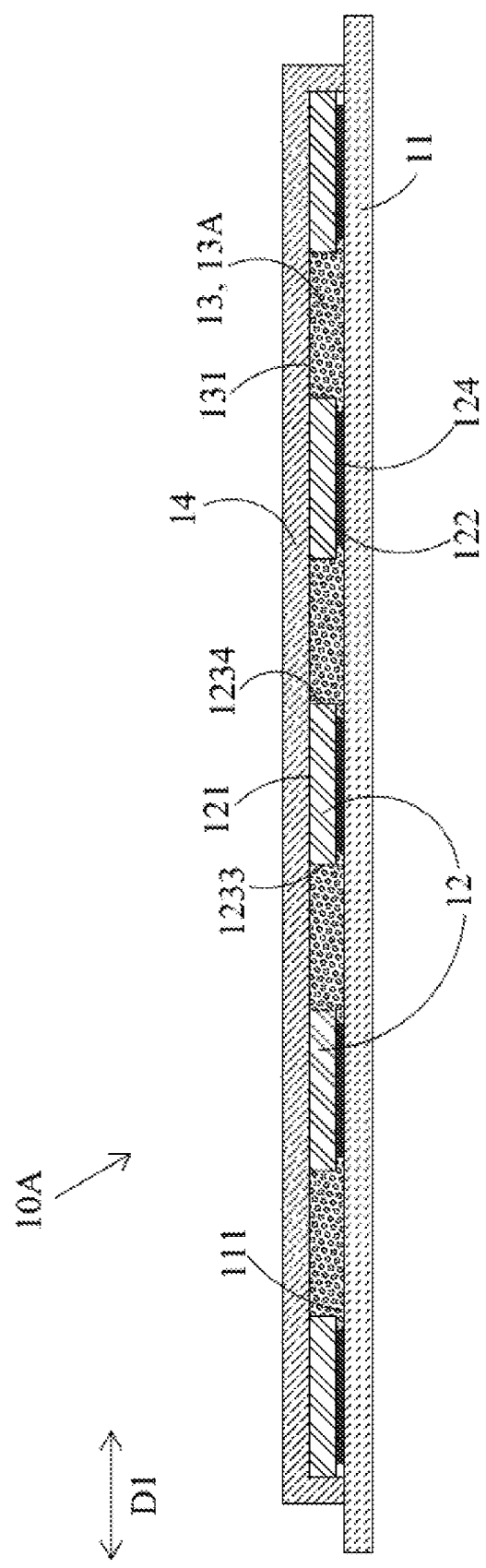
FIG. 1C is a cross-sectional view of the chip-scale linear light-emitting device shown in FIG. 1A.

As illustrated from FIG. 1A to FIG. 1C are a side cross sectional view, a front view and a front cross-sectional view of a chip-scale linear light-emitting device 10A according to a first embodiment of the present disclosure. The linear light-emitting device 10A can provide a linearly and uniformly distributed light radiation pattern so as to reduce dark areas formed on a light-incident surface 21 of a light guide plate 20 (as shown in FIG. 15A, FIG. 15B, FIG. 16A, and FIG. 16B). The linear light-emitting device 10A can include a linear and rectangular submount substrate 11, a plurality of LED semiconductor chips 12, a chip-scale packaging structure 13 (hereinafter referred to as the packaging structure 13), and a reflective structure 14. The technical details of each component are described in the following order.

The submount substrate 11 is provided so that other components of the linear light-emitting device 10A can be disposed thereon, and may be a good reflector to prevent the light beam from leaking through the submount substrate 11. The submount substrate 11 may include a substrate type such as a PCB, a ceramic substrate, a glass substrate, or a metal-core PCB, and the submount substrate 11 of the present embodiment is, for example, a PCB. The shape of the submount substrate 11 may be a long strip-shaped board, and may include a substrate-top surface 111 having a rectangular shape, wherein a first horizontal direction $D_1$ (hereinafter referred to as a horizontal direction $D_1$) and a second horizontal direction (hereinafter referred to as a horizontal direction $D_2$) are specified on the substrate-top surface 111 and are perpendicular to each other. The horizontal direction $D_1$ is along the length direction of the substrate-top surface 111, and the horizontal direction $D_2$ is along the width direction of the substrate-top surface 111. Further, the horizontal directions $D_1$ and $D_2$ are both perpendicular to the normal direction (thickness direction) $D_3$ of the substrate-top surface 111.

The plurality of the LED semiconductor chips 12 can be disposed adjacent to one another on the substrate-top surface 111 along the horizontal direction $D_1$ and are spaced apart from each other to form a linear LED semiconductor chip array. Each of the LED semiconductor chips 12 can be a flip-chip LED semiconductor chip, which comprises a chip-upper surface 121, a chip-lower surface 122, a plurality of chip-edge surfaces 1231, 1232, 1233 and 1234, and a set of electrodes 124. Specifically, the chip-edge surfaces comprise a first chip-edge surface 1231, a second chip-edge surface 1232, a third chip-edge surface 1233, and a fourth chip-edge surface 1234; and an electroluminescent layer (not shown) of the LED semiconductor chip 12 is disposed adjacent to the chip-lower surface 122 of the LED semiconductor chip 12 and above the set of electrodes 124, and the space defined by the electroluminescent layer, the chip-upper surface 121 and the chip-edge surfaces 1231, 1232, 1233 and 1234 includes an optically transparent substrate material (for example, sapphire). The height of the flip-chip LED semiconductor chip 12 (corresponding to the height of the chip-edge surfaces 1231, 1232, 1233 and 1234) is not more than a chip-scale size of about 0.3 mm, about 0.2 mm, or about 0.1 mm.

The chip-upper surface 121 and the chip-lower surface 122 are oppositely disposed, and the chip-upper surface 121 and the chip-lower surface 122 may be rectangular or square. The two chip-edge surfaces 1231, 1232 are arranged substantially in parallel to each other along the horizontal direction $D_1$, are opposite to or facing one another, and are spaced apart from each other along the horizontal direction $D_2$, the other two chip-edge surfaces 1233, 1234 are oppositely disposed or facing one another along the horizontal direction $D_1$, the chip-edge surfaces 1231, 1232, 1233 and 1234 are connected to each other to form an annular shape (for example, a rectangular ring), and the chip-edge surfaces 1231, 1232, 1233 and 1234 are also connected to and extend between the chip-upper surface 121 and the chip-lower surface 122. In other words, the chip-edge surfaces 1231, 1232, 1233 and 1234 are formed along the edges of the chip-upper surface 121 and the edges of the chip-lower surface 122.

The set of electrodes 124 can be disposed on the chip-lower surface 122 so that the set of electrodes 124 and the chip-lower surface 122 may form a lower electrode surface of the LED semiconductor chip 12. The set of electrodes 124 includes at least two electrodes including a positive electrode and a negative electrode so that electrical energy can be supplied through the electrodes to the LED semiconductor chip 12 to generate a primary light (for example, blue light). In addition, since the LED semiconductor chip 12 is of a flip-chip type, the chip-upper surface 121 is not configured with an electrode, and the primary light emitted by the LED semiconductor chip 12 can be outwardly radiated from any of the chip-upper surface 121 and the chip-edge surfaces 1231, 1232, 1233 and 1234. That is, the LED semiconductor chip 12 is a five-surface emitting light source. The set of electrodes 124 is also electrically connected to, for example, bonding pads on the substrate-top surface 111, through metal wires, conductive vias, or the like (not shown) on the substrate-top surface 111 of the submount substrate 11.

Figure 1D:
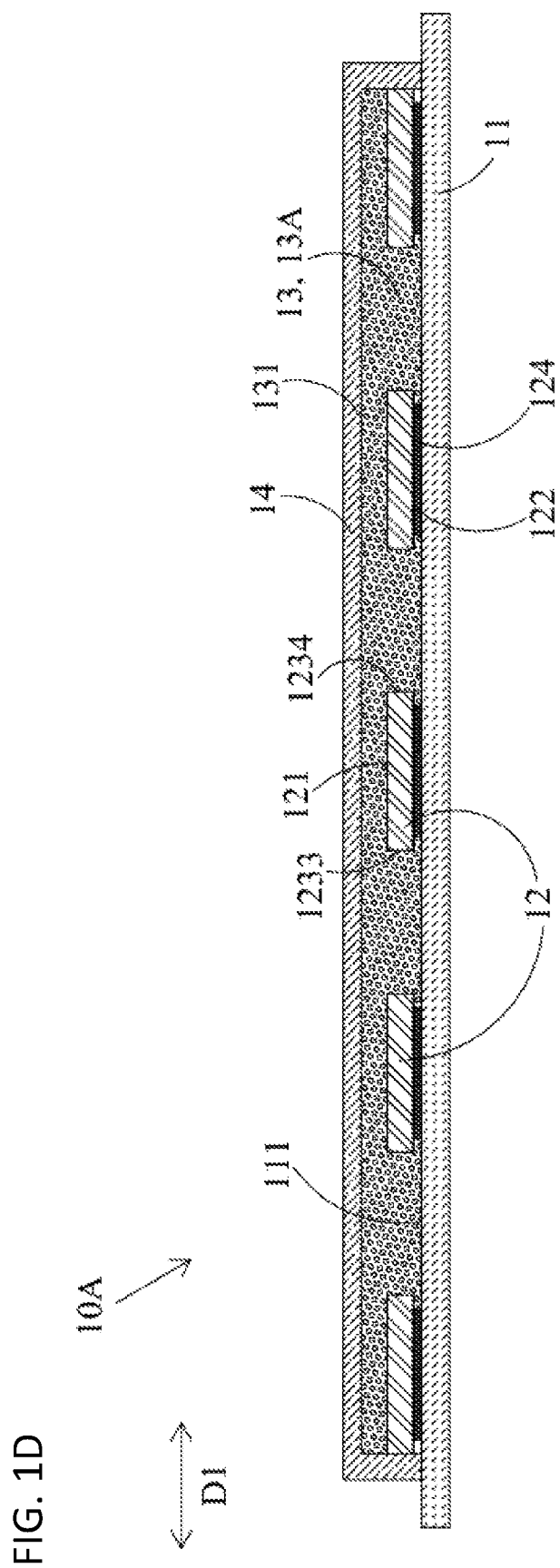
FIG. 1D is a cross-sectional view showing another variant embodiment of the chip-scale linear light-emitting device in accordance with the first embodiment of the present disclosure.

The packaging structure 13 can be disposed on the substrate-top surface 111 of the submount substrate 11 and cover at least the second chip-edge surfaces 1232 of the LED semiconductor chips 12. In other words, the packaging structure 13 is formed at least on the side of the second chip-edge surface 1232 to be in contact or spaced apart from the chip-edge surface 1232, and the height of the packaging structure 13 is not less than the height of the chip-edge surface 1232. In the present embodiment, the packaging structure 13 is in contact and directly covers the chip-edge surface 1232. In addition, the packaging structure 13 can also cover other chip-edge surfaces 1231, 1233, and 1234 of the LED semiconductor chip 12, and optionally cover the chip-upper surface 121 of the LED semiconductor chip 12 (as shown in FIG. 1D). In other words, the packaging structure 13 can cover the chip-upper surface 121 and the chip-edge surfaces 1231, 1232, and 1234 of the LED semiconductor chip 12, and can directly cover these surfaces. In addition, the chip-edge surfaces 1233 and 1234 of the two LED semiconductor chips located on the left and right sides (the leftmost and the rightmost LED semiconductor chips 12) along the horizontal direction $D_1$ may be covered by the reflective structure 14 to be described in detail later without being covered by the packaging structure 13.

The packaging structure 13 includes a package-top surface 131 and a main light-emitting side surface 132 (hereinafter referred to as the light-emitting side surface 132). The primary light generated by the LED semiconductor chip 12 passes through the packaging structure 13 and is then emitted outward through the light-emitting side surface 132. The light-emitting side surface 132 and the second chip-edge surface 1232 of the LED semiconductor chip 12 are disposed substantially parallel to each other along the horizontal direction $D_1$, are opposite to or facing one another, and are spaced apart along the horizontal direction $D_2$. In other words, along the horizontal direction $D_2$, the light-emitting side surface 132 is located outside the chip-edge surface 1232 without direct contact with the chip-edge surface 1232. The light-emitting side surface 132 is substantially parallel to the chip-edge surface 1232. That is, the two surfaces are designed to be parallel to each other. However, due to fabrication process tolerances and variations, the two surfaces may be slightly inclined. With a slight inclination, the light-emitting side surface 132 the chip-edge surfaces 1232 are still considered to be substantially parallel to each other.

The light-emitting side surface 132 is also substantially perpendicular to the lower electrode surface (the set of electrodes 124 or the chip-lower surface 122) of the LED semiconductor chip 12 or the substrate-top surface 111 of the submount substrate 11. That is, the light-emitting side surface 132 and the lower electrode surface (or substrate-top surface 111) are designed to be fabricated as vertical. However, due to factors such as tolerances and variations of the fabrication process, the light-emitting side surface 132 may have a slight inclination with respect to the lower electrode surface. With such a slight inclination, the light-emitting side surface 132 and the lower electrode surface are still regarded to be substantially perpendicular to each other.

In addition, the size of the packaging structure 13 is about on the order of a chip scale. That is, the size of the packaging structure 13 is about on the order of the size of the LED semiconductor chip array. For example, the height of the light-emitting side surface of the packaging structure 13 (the dimension along the vertical direction $D_3$) is equal to or greater than the height of the LED semiconductor chip array (e.g., up to about 6 times greater, up to about 3 times greater, up to about 2 times greater, or up to about 1.2 times greater). The height of the light-emitting side surface 132 of the packaging structure 13 is not more than about 1 mm, or not more than about 0.5 mm, about 0.3 mm, or about 0.2 mm.

When the number of LED semiconductor chips 12 becomes larger (for example, three or more), the length of the light-emitting side surface 132 in the $D_1$ direction is much larger than the height in the $D_3$ direction, so that the light-emitting side surface 132 is an elongated rectangle (as shown in FIG. 1B).

The packaging structure 13 can include a photoluminescent element 13A that can convert a portion of the primary light (e.g., blue light) generated by the LED semiconductor chip 12 into a secondary light and/or a third light (e.g., a green light and/or a red light). The photoluminescent element 13A may include, for example, an optically transparent resin material and a photoluminescent material (phosphor powder or quantum dots), and the photoluminescent element 13A may directly cover the second chip-edge surface 1232 of the LED semiconductor chip 12.

The reflective structure 14 can reflect and block the primary light generated by the LED semiconductor chip 12 and guide the primary light toward the light-emitting side surface 132 of the packaging structure 13. As for the material composition, the reflective structure 14 may be made of a material containing an optically transparent resin material dispersed with optical scattering particles. The optically transparent resin material may be, for example, polyphthalamide (PPA), polycyclohexylene-dimethylene terephthalate (PCT), or epoxy molding compound (EMC), or silicone rubber; and the optical scattering particles may be, for example, titanium dioxide, boron nitride, silicon dioxide or aluminum oxide or other ceramic particles.

The reflective structure 14 is disposed on the substrate-top surface 111 of the submount substrate 11 and covers a plurality of the first chip-edge surfaces 1231 and a plurality of the chip-upper surfaces 121 of the LED semiconductor chips array 12, and also covers the package-top surface 131 of the packaging structure 13, but exposes the second chip-edge surfaces 1232 of the LED semiconductor chips 12 and the light-emitting side surface 132 of the packaging structure 13. In other words, the reflective structure 14 can cover the surfaces directly or cover the surfaces indirectly, and can reflect and block the primary light emitted toward the covered surfaces. The chip-edge surfaces 1232 of the LED semiconductor chips 12 and the light-emitting side surface 132 of the packaging structure 13 are not covered by the reflective structure 14. The primary light and/or the secondary light converted by the packaging structure 13 can be emitted from the light-emitting side surface 132 to form a linear light source with a light beam L radiated outwardly by the linear light-emitting device 10A.

In this embodiment, the packaging structure 13 does not cover the chip-upper surfaces 121 of the LED semiconductor chips 12, and the reflective structure 14 directly covers the chip-upper surface 121 and the package-top surface 131 of the packaging structure 13. In another variant embodiment as shown in FIG. 1D, the chip-upper surfaces 121 of the LED semiconductor chips 12 are directly covered by the packaging structure 13, so that the reflective structure 14 indirectly covers the chip-upper surfaces of the LED semiconductor chips 12. In another variant embodiment (not shown), the packaging structure 13 is simultaneously formed on the second chip-edge surfaces 1232. The reflective structure 14 directly covers the package-top surface 131 of the packaging structure 13 and the chip-upper surfaces 121 of the LED semiconductor chips 12, as well as directly covers the first chip-edge surfaces 1231. On the other hand, in the horizontal direction $D_1$, the reflective structure 14 can directly or indirectly cover the chip-edge surfaces 1233, 1234 of the two LED semiconductor chips 12 on the left and right sides of the LED semiconductor chips array.

Thereby, after a primary light (for example, a blue light) emitted by the LED semiconductor chips 12 is transmitted to the packaging structure 13 (photoluminescent element 13A), the wavelength of a portion of the primary light is converted via the photoluminescent element 13A (for example, a yellow light), and the wavelength of another portion of the primary light remains the same. The two portions (blue and yellow) of the light beams are mixed to form a white light beam L (represented by the dashed arrow in FIG. 1A). In addition, the primary light emitted from the LED semiconductor chips 12 toward the chip-upper surface 121 and the chip-edge surfaces 1231, 1233, and 1234 can be reflected back by the reflective structure 14 and guided toward the light-emitting side surface 132, which is not covered by the reflective structure 14. In other words, the mixed primary light emitted from the chip-edge surface 1232 and the converted secondary light via the packaging structure 13 is radiated outward from the light-emitting side surface 132.

It can be seen that the primary light from the LED semiconductor chip 12 and/or the secondary light converted from the packaging structure 13 can selectively escape from the light-emitting side surface 132, which is not covered by the reflective structure 14 and the submount substrate 11. In other words, the light beam L radiated by the linear light-emitting device 10A is mainly emitted laterally, so that a side-view type linear light-emitting device with a linear radiation pattern can be formed.

On the other hand, the reflective structure 14 can guide a portion of the primary light to emit between the two adjacent LED semiconductor chips 12 along the horizontal direction $D_1$. That is, the primary light is emitted outwardly through the third and the fourth chip-edge surfaces 1233, 1234. Therefore, the light beam L is radiated outwardly from regions corresponding to the light-emitting side surface 132 facing the chip-edge surfaces 1232, and also from a region corresponding to the light-emitting side surface between any of the two adjacent LED semiconductor chips 12 so that the region between any of the two adjacent LED semiconductor chips 12 is also emitted by the light beam L via the mixed light. In other words, an optical cavity can be formed by the reflective structure 14 for light mixing of the primary light generated by the LED semiconductor chip 12 such that the light-emitting side surface 132 has the light beam L emitted to form a substantially uniformly distributed linear light radiation pattern.

Figure 1E:
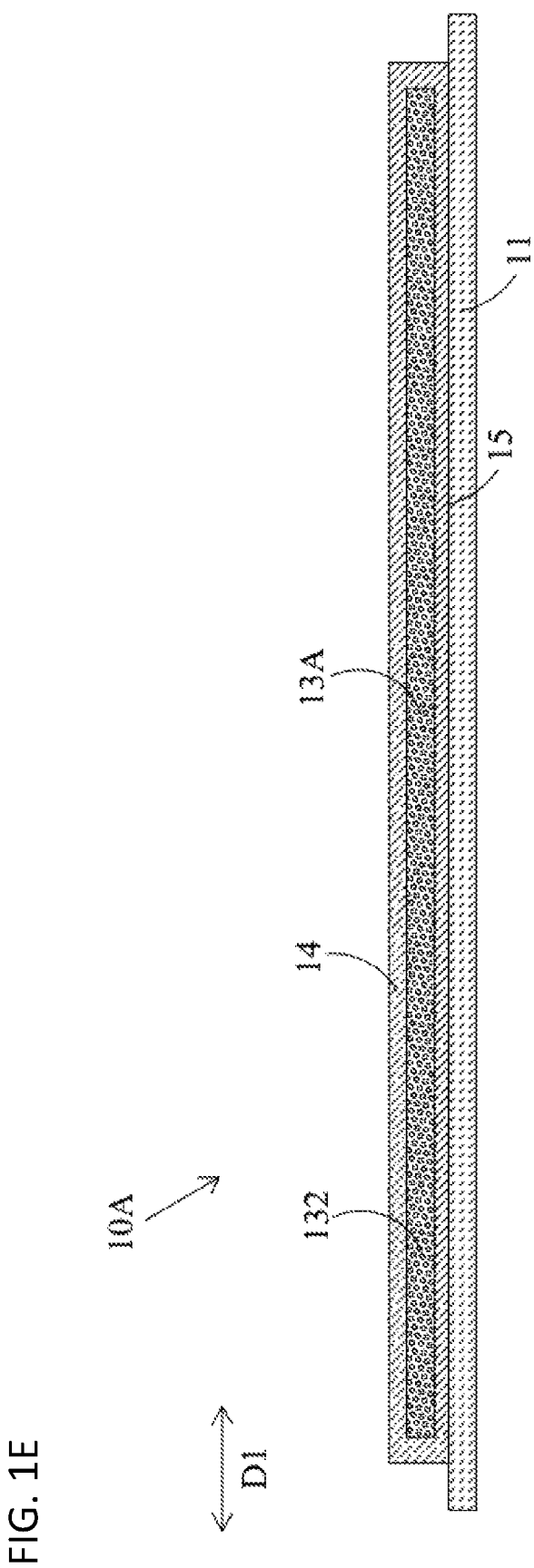
FIG. 1E and FIG. 1F are a front view and a cross-sectional view, respectively, showing another variant embodiment of the chip-scale linear light-emitting device according to the first embodiment of the present disclosure.
Figure 1F:
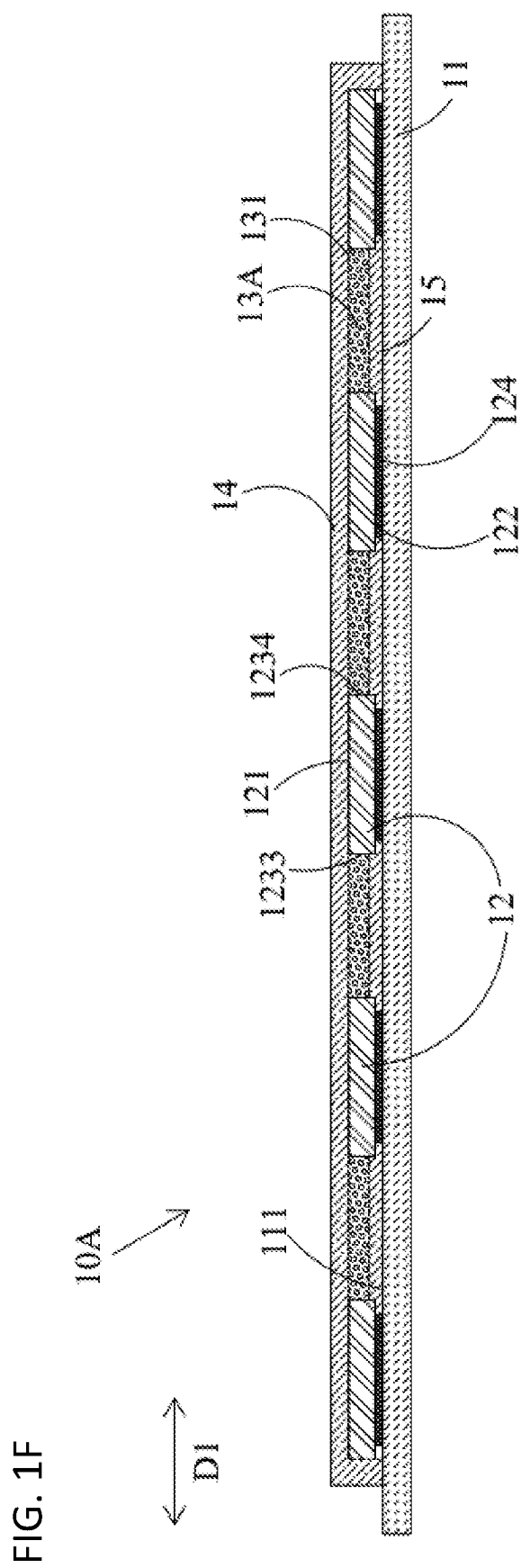

As illustrated in FIG. 1E and FIG. 1F, in another variant embodiment of the linear light-emitting device 10A, the linear light-emitting device 10A may include a reflective layer 15, which may be made of a high-reflectivity metallic material, a resin material, or the same material as the reflective structure 14. After the LED semiconductor chip 12 is disposed on the substrate-top surface 111 of the submount substrate 11, the reflective layer 15 can be formed on the substrate-top surface 111 of the submount substrate 11. Therefore, the reflective layer 15 does not affect the electrical connectivity between the set of electrodes 124 of the LED semiconductor chip 12 and the bonding pads of the submount substrate 11. The reflective layer 15 may partially cover the chip-edge surfaces 1231, 1232, 1233 and 1234 of each LED semiconductor chip 12. In other words, the reflective layer 15 is disposed adjacent to the chip-edge surfaces 1231, 1232, 1233 and 1234. Then, the packaging structure 13 is disposed on the reflective layer 15 (indirectly disposed on the surface of the submount substrate 11), and the light-emitting side surface 132 of the packaging structure 13 is disposed substantially perpendicular and connecting to the surface of the reflective layer 15. Thereby, the reflective structure 14 and the reflective layer 15 can form an optical cavity to effectively guide the primary light of the LED semiconductor chip 12 toward the light-emitting side surface 132 of the packaging structure 13, further increasing the luminous efficiency of the linear light-emitting device 10A.

As illustrated from FIG. 2A to FIG. 2E, a method of fabricating the above-described linear light-emitting device 10A will be described. Some of the technical specifications of the fabricating method can be referred to the above-mentioned technical specifications of the linear light-emitting device 10A.

Figure 2A:
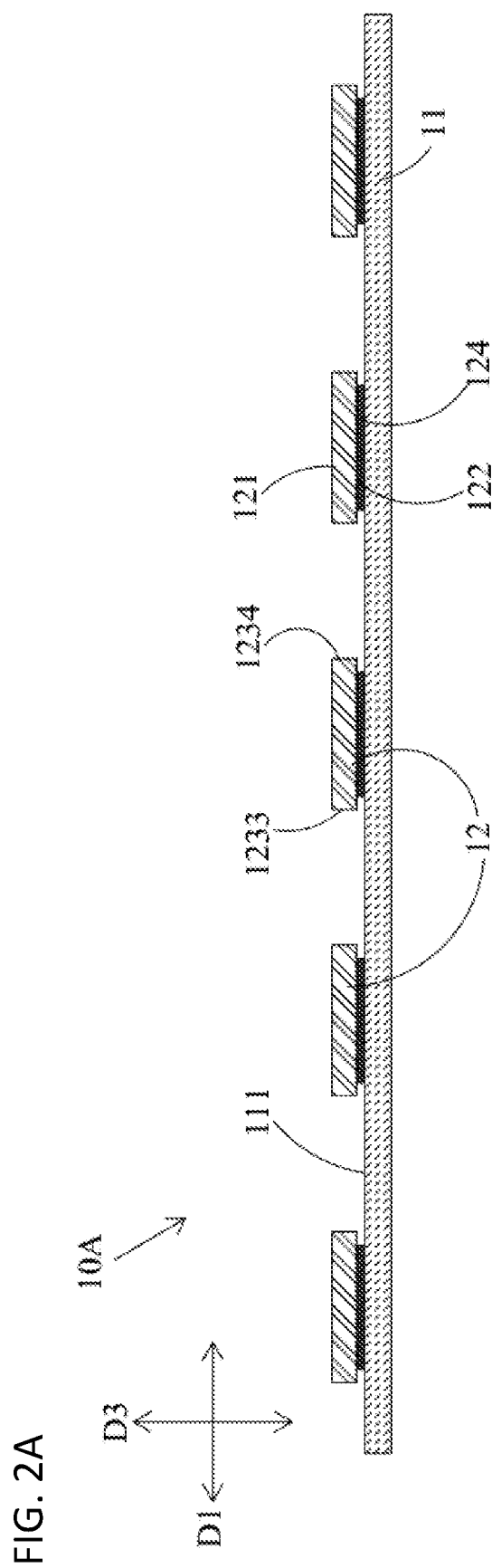
FIG. 2A, FIG. 2B, FIG. 2C, FIG. 2D, and FIG. 2E are schematic views illustrating the fabricating stages of the chip-scale linear light-emitting device shown in FIG. 1A.
Figure 2B:
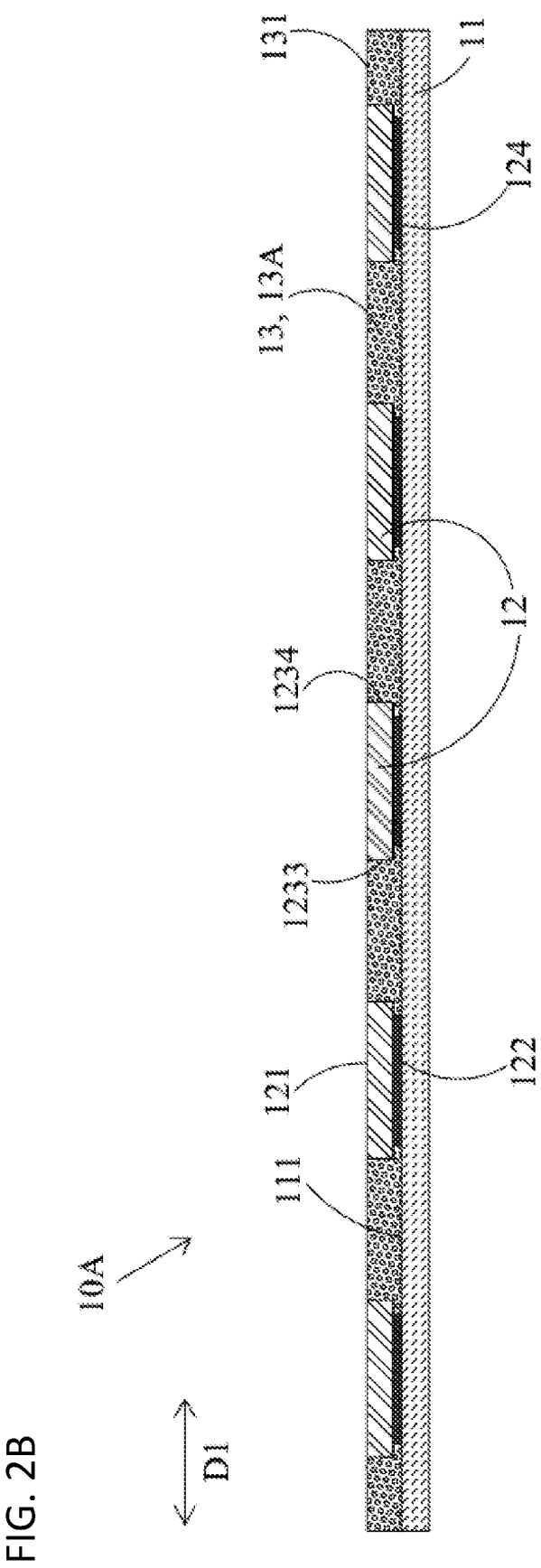
Figure 2C:
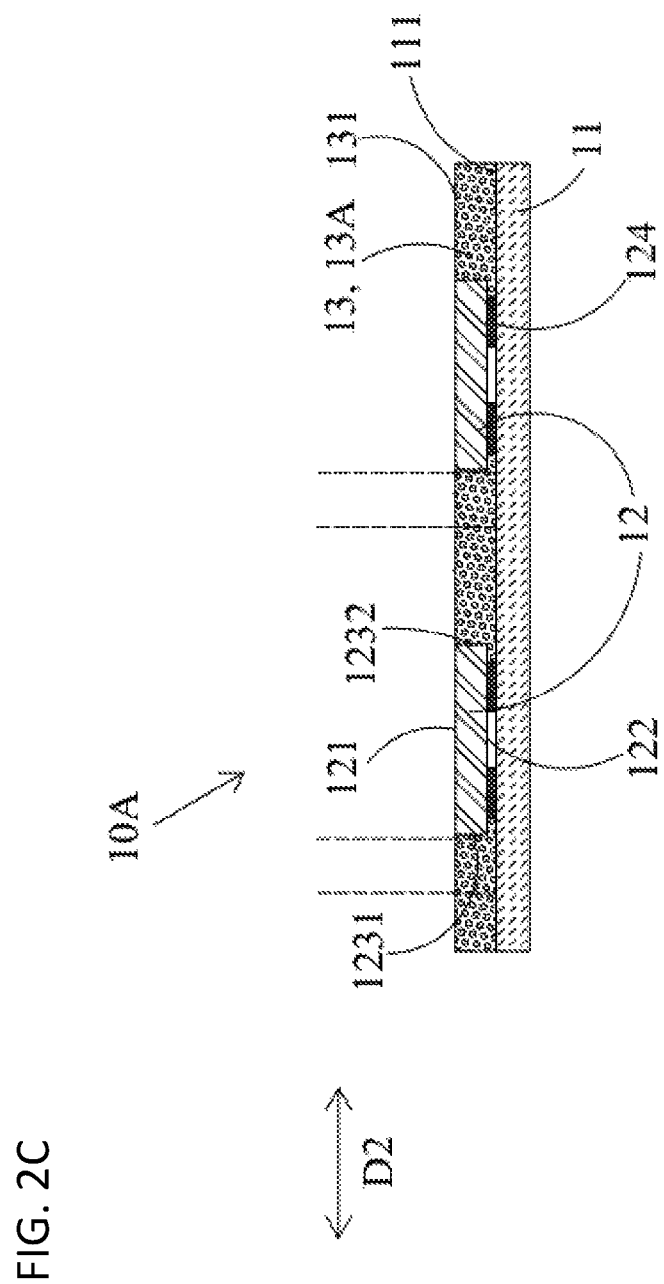

As shown in FIG. 2A, the plurality of LED semiconductor chips 12 are first disposed on the submount substrate 11 and spaced apart at substantially equal intervals to form an LED semiconductor chip array. The following descriptions are taking two rows of LED semiconductor chip arrays spaced apart along the horizontal direction $D_2$ as an example, which is illustrated in FIG. 2C. If a reflective layer 15 as shown in FIG. 1E and FIG. 1F is desirable, it can be formed on the submount substrate 11 by spraying, printing, or molding. Thereafter, as shown in FIG. 2B and FIG. 2C, the packaging structure 13 is formed on the submount substrate 11. That is, the composition materials of the packaging structure 13 (for example, an optically transparent resin material mixed with photoluminescence material) are sprayed, printed, molded, or the like, and then the composition materials are solidified into the packaging structure 13. The formed packaging structure 13 at least covers the second chip-edge surface 1232 of the LED semiconductor chip 12. The other chip-edge surfaces 1231, 1233 and 1234 may be covered as well. In addition, the packaging structure 13 may be formed such that its package-top surface 131 is substantially flush with the chip-upper surface 121 of the LED semiconductor chip 12 without covering the chip-upper surface 121. Alternatively, the packaging structure 13 is formed such that its package-top surface 131 is higher than the chip-upper surface 121 so that the chip-upper surface 121 is covered to form the linear light-emitting device 10A illustrated in FIG. 1D.

Figure 2D:
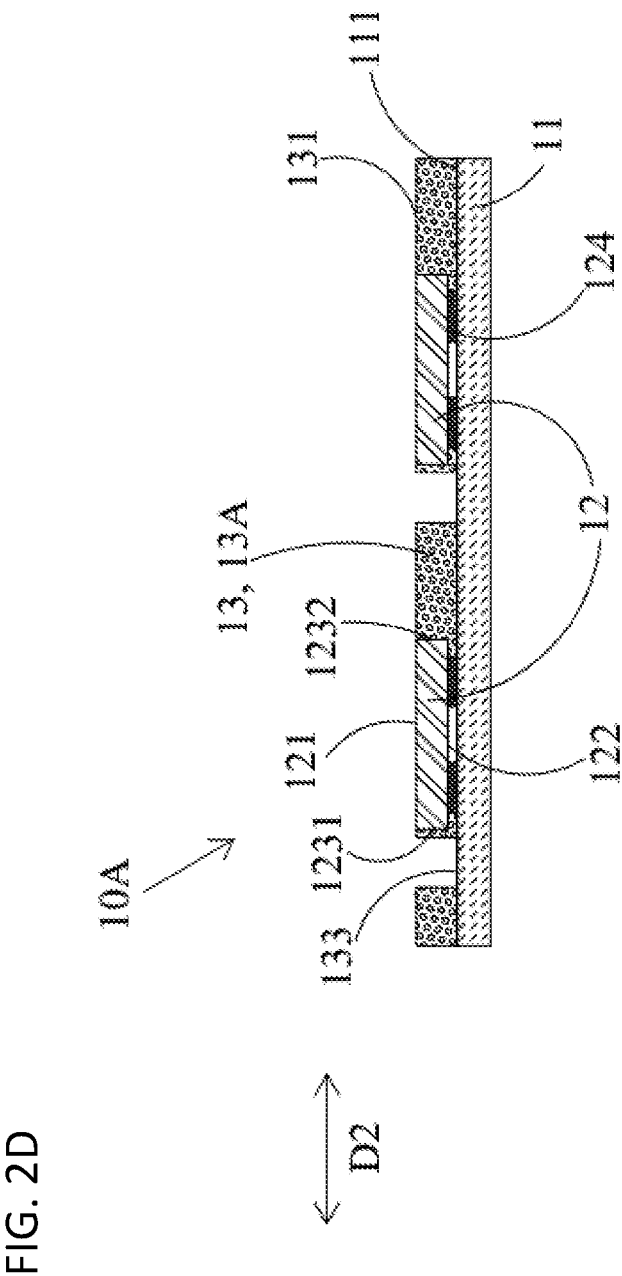

Next, as shown in FIG. 2D, a portion of the packaging structure 13 (between the two dashed lines shown in FIG. 2C) is removed along the horizontal direction $D_1$, which is located adjacent to the first chip-edge surface 1231 of the LED semiconductor chip 12, wherein a recessed groove 133 is formed beside the first chip-edge surface 1231. The recessed groove 133 is an elongated groove extending along the horizontal direction $D_1$. After the recessed groove 133 is formed, the first chip-edge surface 1231, which is subsequently to be covered by the reflective structure 14, can be temporarily exposed. The chip-edge surface 1231 can be covered, partially covered, or not covered by the packaging structure 13.

Figure 2E:
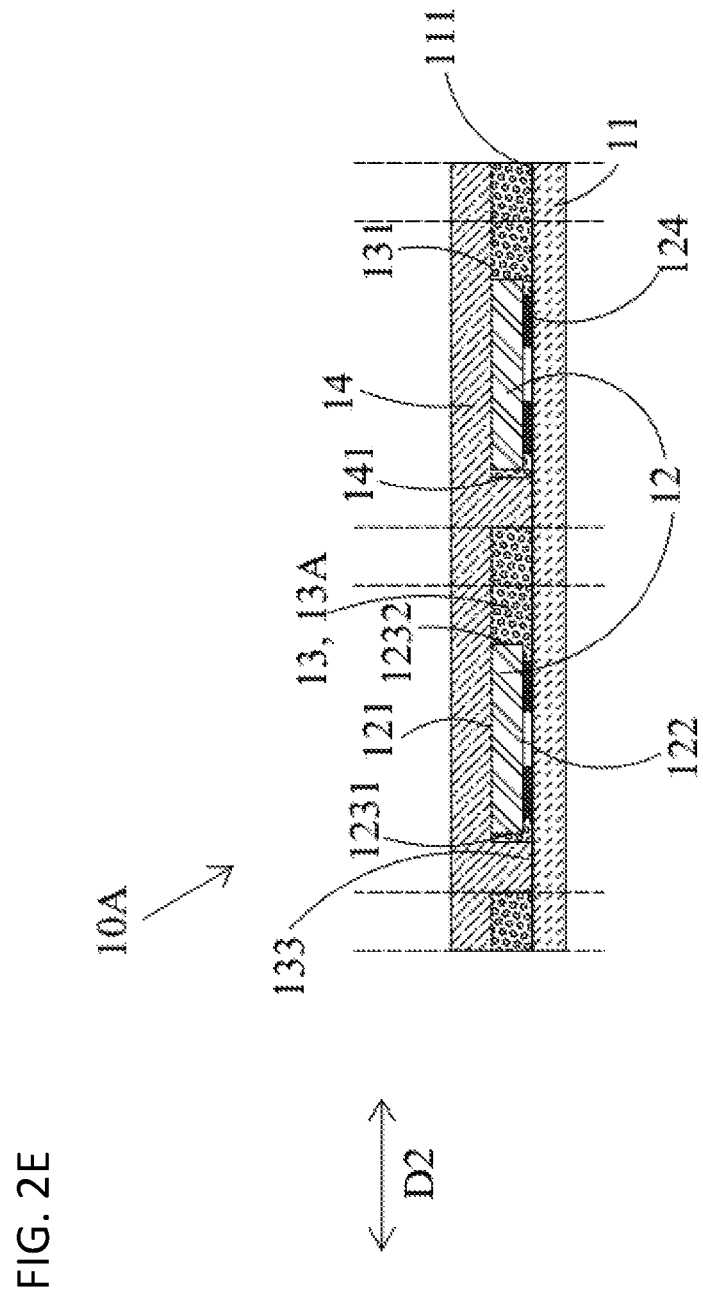

As shown in FIG. 2E, the reflective structure 14 is then formed on the submount substrate 11, the LED semiconductor chip 12, and the packaging structure 13. That is, the reflective structure 14 is formed by spraying, printing, or molding using a reflective composition material (for example, an optically transparent resin material dispersed with optical scattering particles). Due to the presence of the recessed groove 133, the formed reflective structure 14 can directly or indirectly cover the first chip-edge surface 1231 and the second chip-edge surface 1232 of the LED semiconductor chip 12, in addition to the chip-upper surface 121 of the LED semiconductor chip 12 and the package-top surface 131 of the packaging structure 13. Furthermore, the formed reflective structure 14 may include a reflective side surface 141 spaced apart from the chip-edge surface 1231 along the horizontal direction $D_2$. In other variant embodiments, the reflective side surface 141 may directly cover the chip-edge surface 1231 (closely conforming to the chip-edge surface 1231). That is, during the previous fabricating stage of forming the recessed groove 133, the packaging structure 13 beside the chip-edge surface 1231 is completely removed. In addition, when the reflective structure 14 is formed, the reflective structure 14 may also cover the third and the fourth chip-edge surfaces 1233 and 1234 of the two adjacent LED semiconductor chips 12 in the horizontal direction of $D_1$.

When the reflective structure 14 is completed, two linear light-emitting devices 10A can be formed by two rows of LED semiconductor chip arrays. The reflective structures 14 between the two linear light-emitting device 10A are still connected, so that a further cutting stage is performed. That is, a portion of the reflective structure 14 and a portion of the packaging structure 13 located outside the second chip-edge surface 1232 are removed along the horizontal direction $D_1$ according to the dashed line as shown in FIG. 2E. A portion of the submount substrate 11 is also simultaneously removed by singulation. As such, the two linear light-emitting devices 10A can be separated from each other, and simultaneously expose the light-emitting side surface 132 of the packaging structure 13 of each of the linear light-emitting devices 10A.

The above is a description of the technical specification of the linear light-emitting device 10A. Next, the technical specification of linear light-emitting devices according to other embodiments of the present disclosure will be described, and the technical specifications (including the fabricating method) of each embodiment of the linear light-emitting devices can be mutually referenced, so that the descriptions of the same components will be omitted or simplified. The technical specifications of each of the embodiments may also be combined or replaced with each other so that further embodiments can be obtained.

Figure 3A:
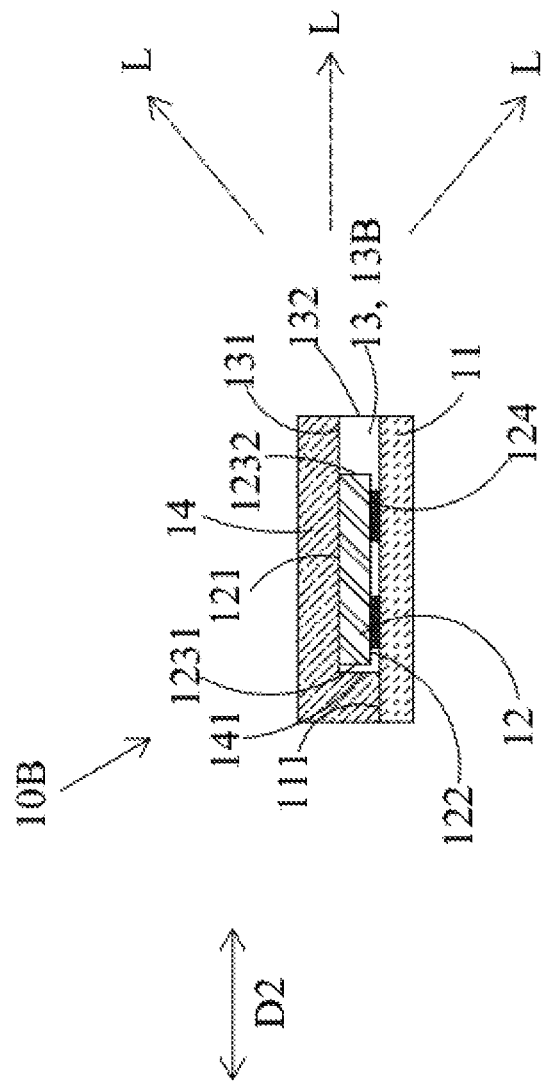
FIG. 3A and FIG. 3B are a side view and a front view of a chip-scale linear light-emitting device according to a second embodiment of the present disclosure.
Figure 3B:
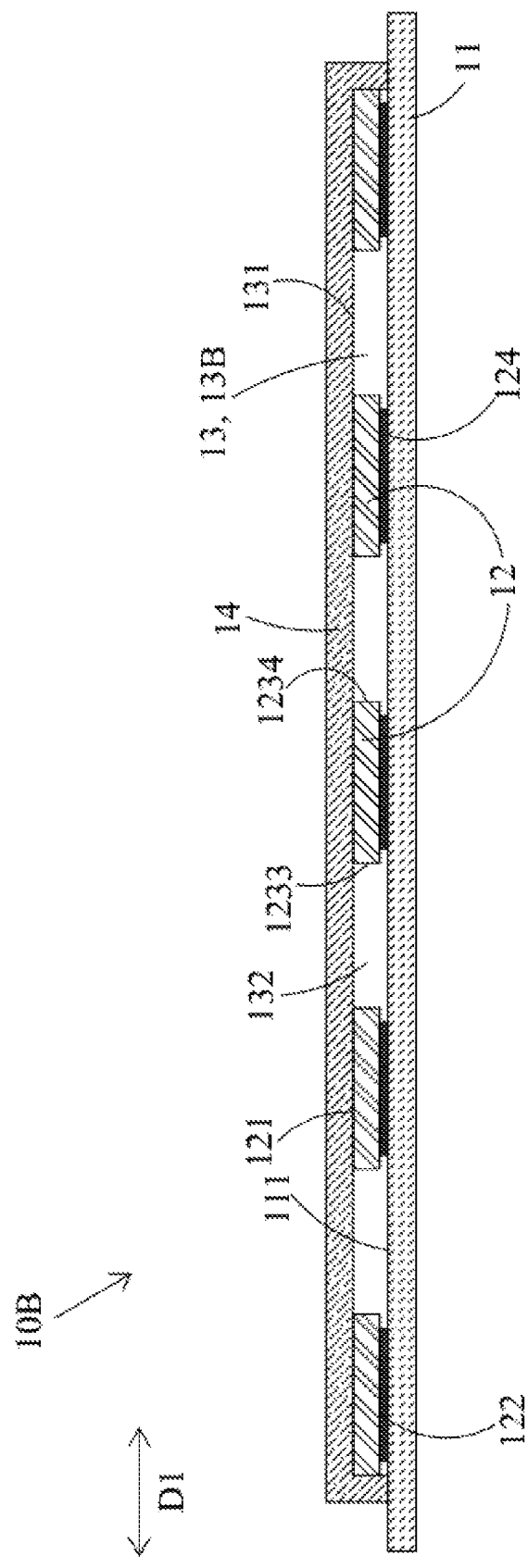

As illustrated in FIG. 3A and FIG. 3B are a side view and a front cross-sectional view, respectively, of a chip-scale linear light-emitting device 10B according to a second embodiment of the present disclosure. The linear light-emitting device 10B differs from the above-described linear light-emitting device 10A, which is specified to provide a linear light beam by mixing a primary light and a converted secondary light to generate a white light or the like, in that the packaging structure 13 is, or includes, a light-transmitting element 13B, which is specified to directly cover the second chip-edge surface 1232 of the LED semiconductor chip 12.

Specifically, the packaging structure 13 does not include color conversion materials such as the photoluminescent element 13A capable of converting the wavelength of the light beam, and includes the light-transmitting element 13B that does not substantially affect the wavelength of the primary light radiated from the LED semiconductor chips 12. The light-transmitting element 13B may be made of an optically transparent resin material such as PPA, PCT, or EMC, or silicone rubber. Thus, the primary light radiated from the LED semiconductor chips 12 passes through the packaging structure 13 (light-transmitting element 13B for the linear light-emitting device 10B). Since its wavelength is not converted by the packaging structure 13, the linear light-emitting device 10B can be specified to provide a linearly and uniformly distributed light source generating a red light, a green light, a blue light, an infrared light or various monochromatic lights such as ultraviolet light.

Figure 3C:
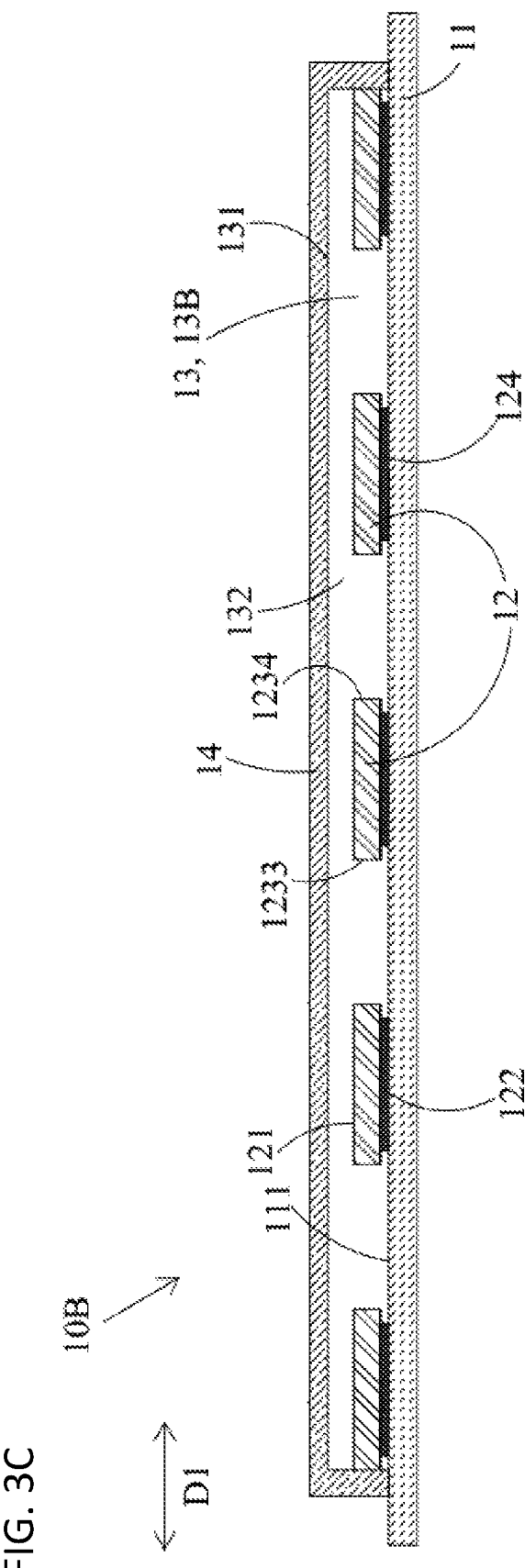
FIG. 3C is a front view showing another variant embodiment of the chip-scale linear light-emitting device according to the second embodiment of the present disclosure.

As illustrated in FIG. 3C, in another variant embodiment, the packaging structure 13 can directly cover the chip-upper surface 121 of the LED semiconductor chip 12, so that the packaging structure 13 is relatively thick to provide a wider light-emitting side surface 132.

Figure 4:
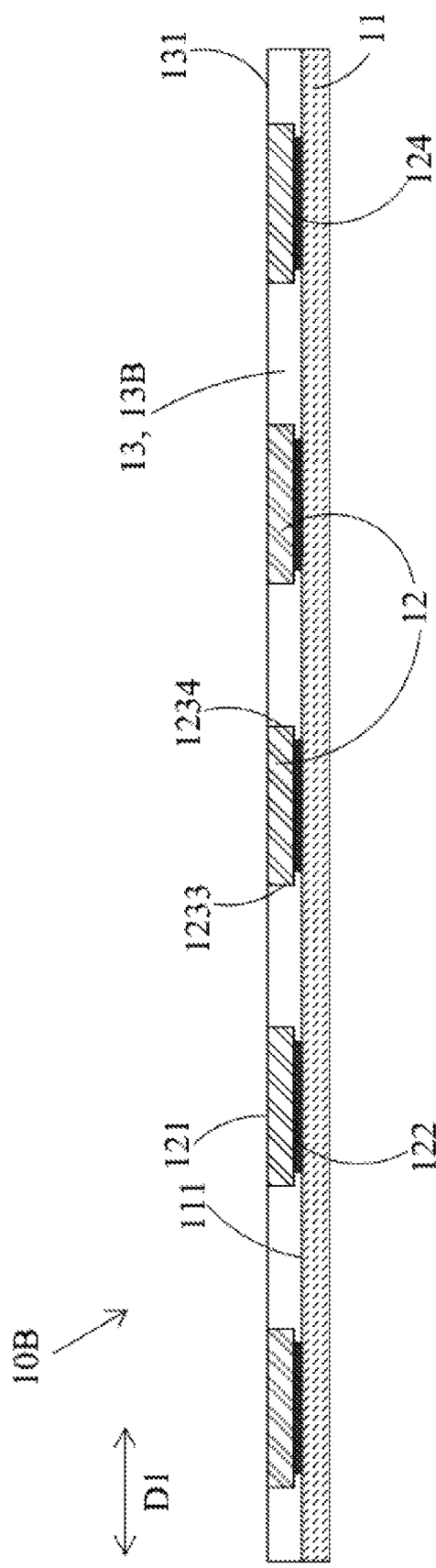
FIG. 4 is a schematic view showing the fabricating stages of the chip-scale linear light-emitting device shown in FIG. 3A.

Next, a fabricating method of the linear light-emitting device 10B will be described. Similar to the above-described fabricating method of the linear light-emitting device 10A, as shown in FIG. 4, the fabricating method is different from the above-described method in the fabricating stage of forming the packaging structure 13, wherein the composition material of the packaging structure 13 is, or includes, a light-transmitting material such as an optically transparent resin material, and photoluminescent materials which convert the wavelength of the primary light are not included in the composition material so that the formed packaging structure 13 is, or includes, the light-transmitting element 13B. Thereafter, the recessed groove 133 and the reflective structure 14 of the packaging structure 13 are formed, and the packaging structure 13, the reflective structure 14, the submount substrate 11, and the like are cut to singulate the linear light-emitting devices 10B.

Figure 5A:
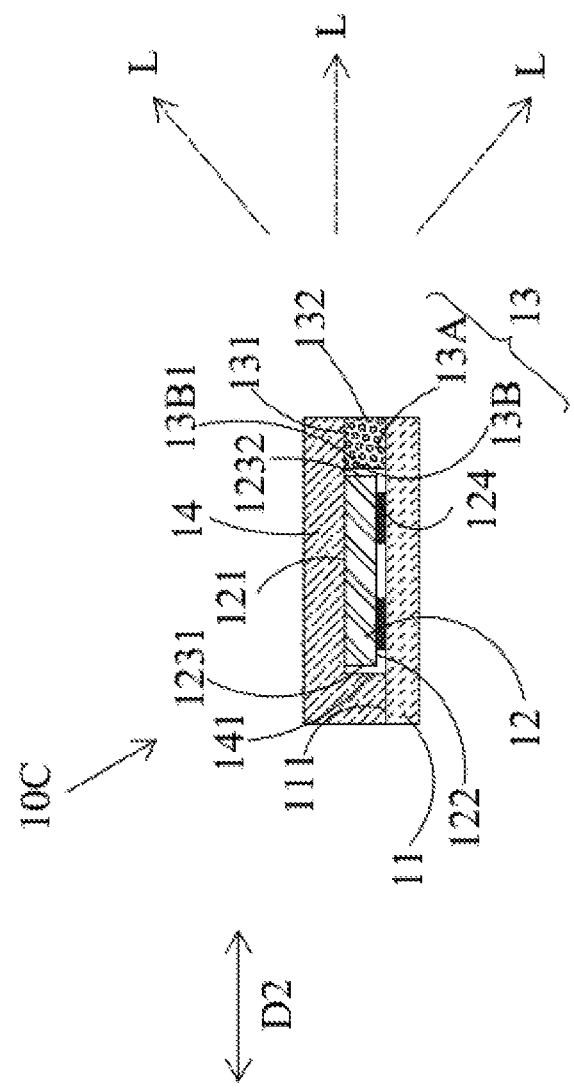
FIG. 5A and FIG. 5B are a side view and a cross-sectional view, respectively, of a chip-scale linear light-emitting device according to a third embodiment of the present disclosure.
Figure 5B:
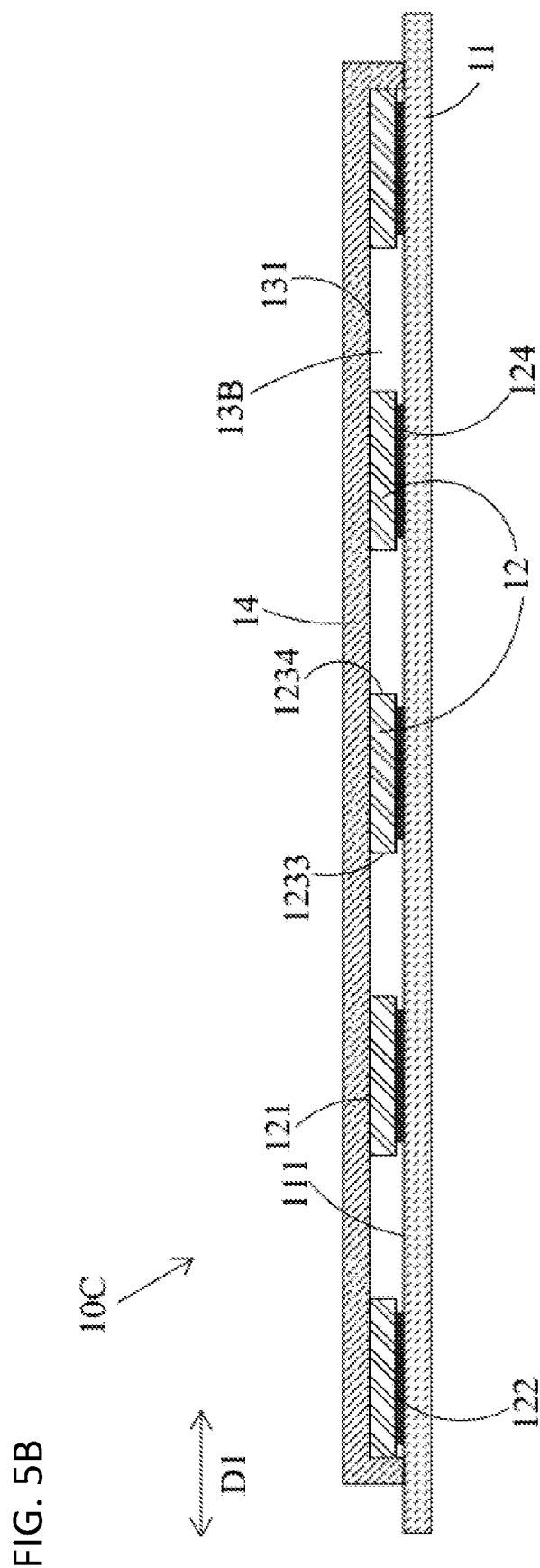

As illustrated in FIG. 5A and FIG. 5B are a side cross-sectional view and a front cross-sectional view, respectively, of a chip-scale linear light-emitting device 10C according to a third embodiment of the present disclosure. The linear light-emitting device 10C is also configured to provide white light or the like, and the linear light-emitting devices 10C and 10A are structurally different, at least in that the packaging structure 13 of the linear light-emitting device 10C includes a photoluminescent element 13A and a light-transmitting element 13B, wherein the light-transmitting element 13B directly covers the second chip-edge surface 1232 of the LED semiconductor chip 12, and the photoluminescent element 13A directly covers one light-transmitting-element-side surface 13B1 (e.g., an outer side surface) of the light-transmitting element 13B to indirectly cover the LED chip-edge surface 1232 of the LED semiconductor chip 12. The light-transmitting-element-side surface 13B1 and the chip-edge surface 1232 are substantially parallel to each other along the horizontal direction $D_1$, are opposite to or facing one another, and are spaced apart along the horizontal direction $D_2$.

Figure 5C:
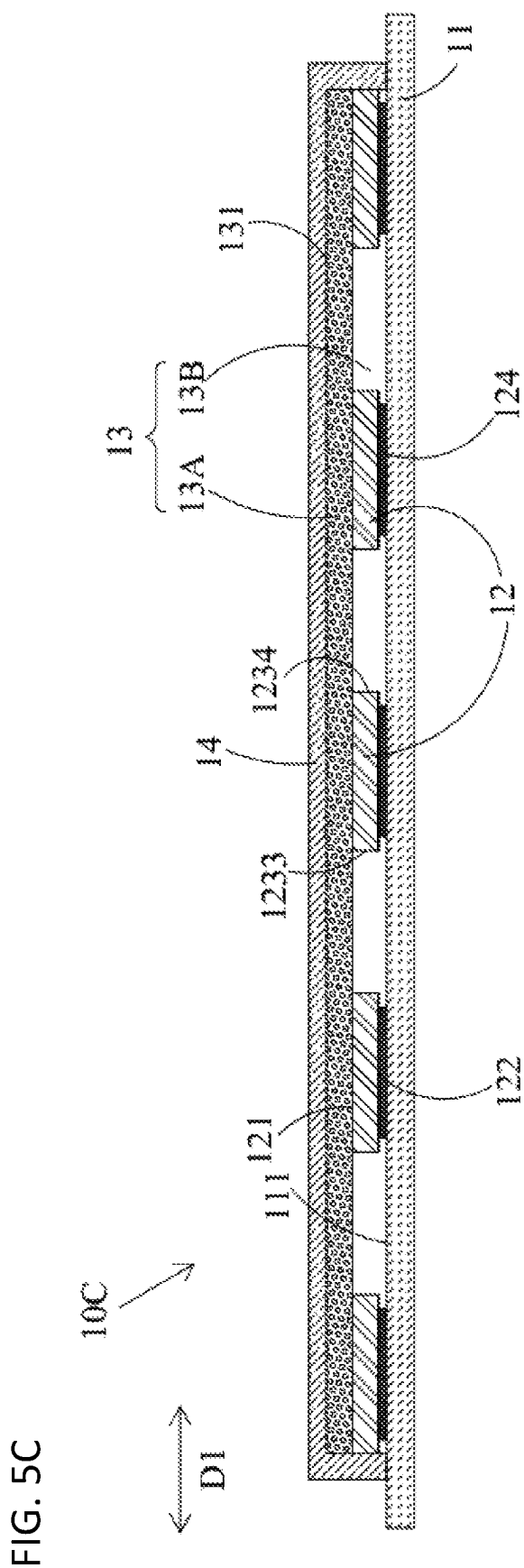
FIG. 5C is a cross-sectional view showing another variant embodiment of the chip-scale linear light-emitting device according to the third embodiment of the present disclosure.

More specifically, the light-transmitting element 13B and the photoluminescent element 13A are sequentially disposed along the normal direction of the chip-edge surface 1232, wherein the light-transmitting element 13B covers and surrounds the chip-edge surfaces 1231, 1232, 1233 and 1234, and the photoluminescent element 13A covers the light-transmitting-element-side surface 13B1 of the light-transmitting element 13B. Therefore, an outer side surface of the photoluminescent element 13A is the light-emitting side surface 132. In addition, the photoluminescent element 13A can cover the chip-upper surface 121 of the LED semiconductor chip 12 (as shown in FIG. 5C) and the top surface of the light-transmitting element 13B, so that the packaging structure 13 includes at least a two-layer stack structure as illustrated in the cross-sectional view of FIG. 5C to provide a wider light-emitting side surface 132. The light-transmitting element 13B may also first cover the chip-upper surface 121 of the LED semiconductor chip 12, and then the photoluminescent element 13A sequentially covers the top surface of the light-transmitting element 13B (not shown).

The photoluminescent element 13A of the linear light-emitting device 10C may be made of the same composition material as the photoluminescent element 13A of the linear light-emitting device 10A; and the light-transmitting element 13B of the linear light-emitting device 10C may be made of the same composition material as the light-transmitting element 13B of the linear light-emitting device 10B.

In this manner, after the primary light of the LED semiconductor chip 12 passes through the light-transmitting element 13B, it travels through the photoluminescent element 13A to be radiated outward from the light-emitting side surface 132, so that the linear light-emitting device 10C can provide a mixed light beam such as white light.

Figure 6A:
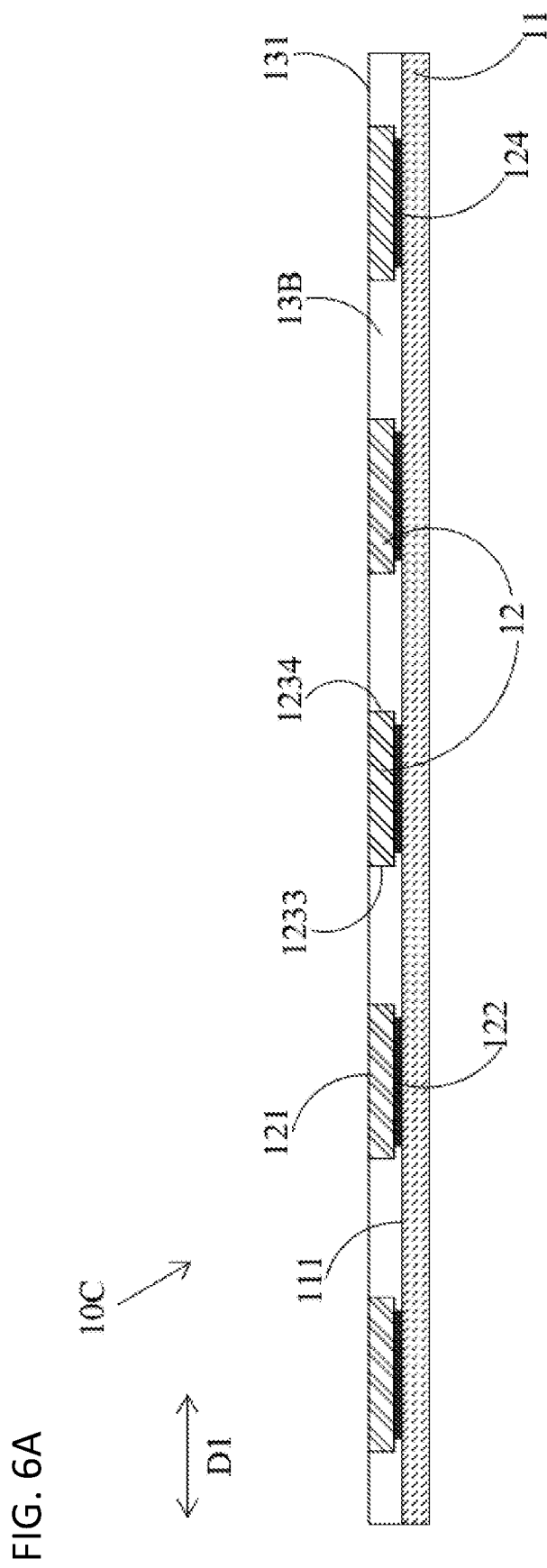
Figure 6B:
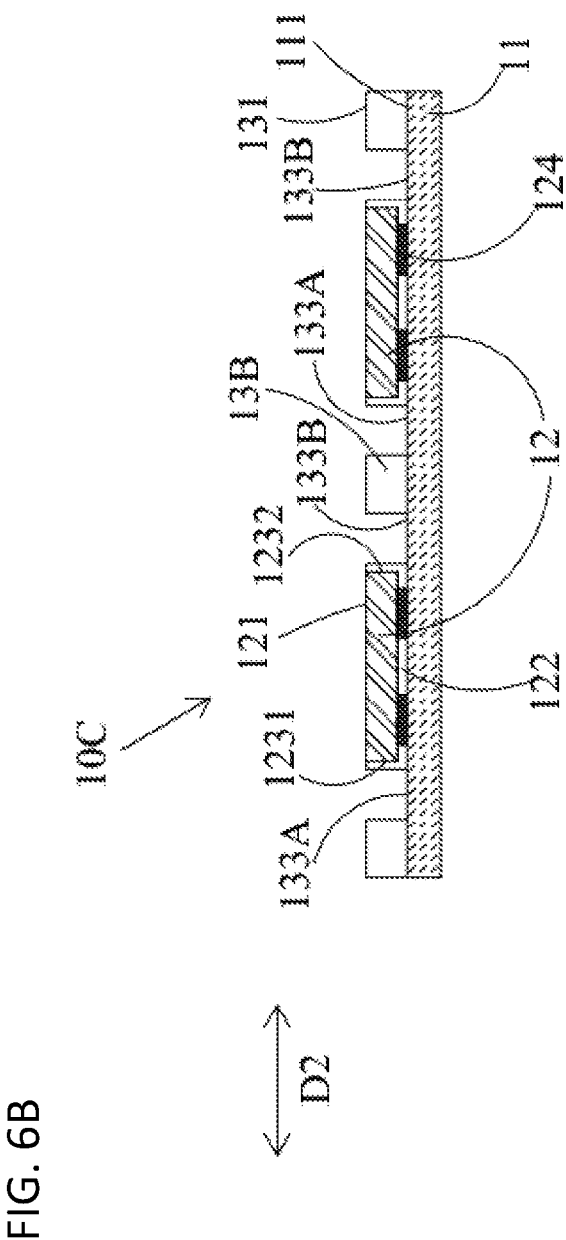

As illustrated from FIG. 6A to FIG. 6E, a method of fabricating the linear light-emitting device 10C will be described. The main difference to fabricate the linear light-emitting device 10A and the linear light-emitting device 10C is in the fabricating stage of forming the packaging structure 13. Specifically, as shown in FIG. 6A, the light-transmitting element 13B is first formed on the submount substrate 11. As shown in FIG. 6B, two portions of the light-transmitting element 13B are respectively removed along the horizontal direction $D_1$, and the two removed portions are located adjacent to the first and the second chip-edge surfaces 1231 and 1232 of the LED semiconductor chip 12 to form a recessed groove 133A and another recessed groove 133B, respectively. To form the recessed grooves 133A and 133B, the light-transmitting element 13B adjacent to the chip-edge surfaces 1231 and 1232 can be completely removed. Alternatively, a small amount of the light-transmitting element 13B can be retained to cover the chip-edge surfaces 1231 and 1232.

Figure 6C:
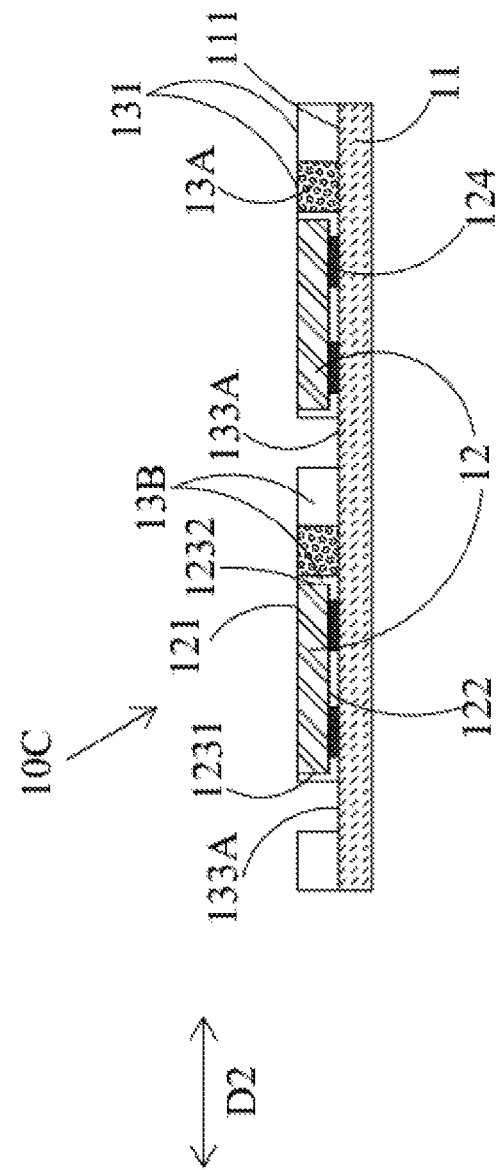
Figure 6D:
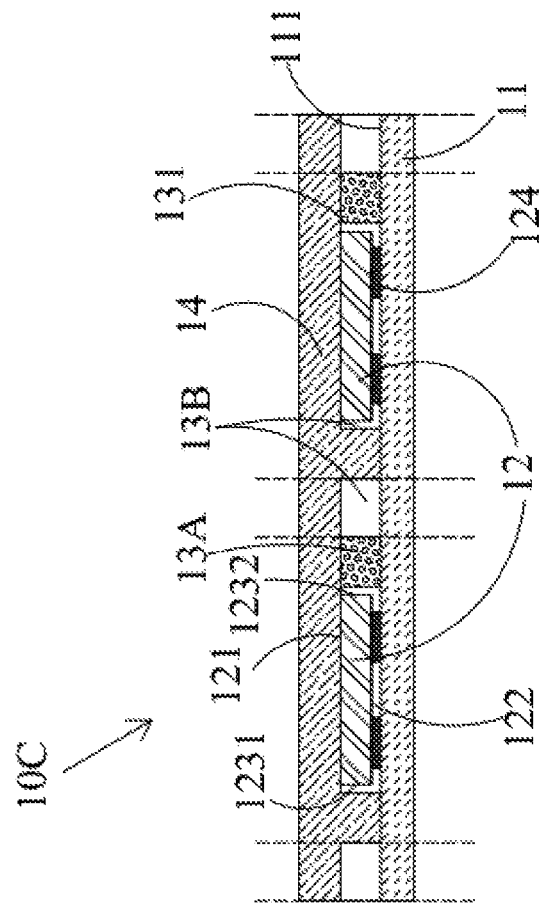
Figure 6E:
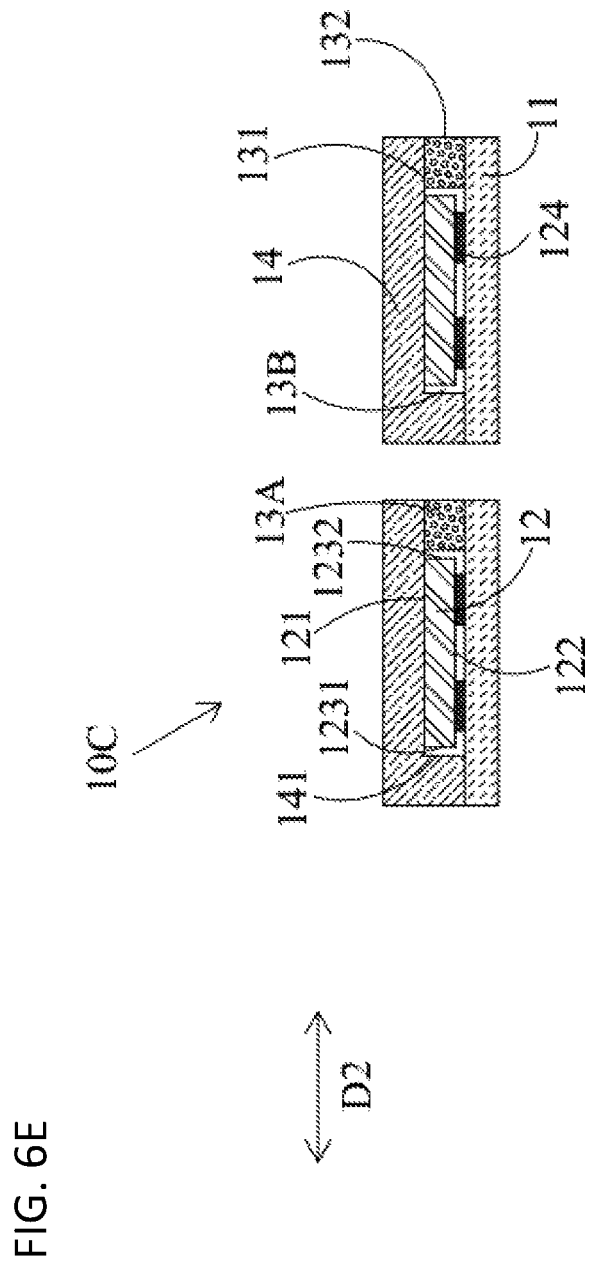

As shown in FIG. 6C, the photoluminescent element 13A is formed in the recessed groove 133B to cover the second chip-edge surface 1232 of the LED semiconductor chip 12. As shown in FIG. 6D, the reflective structure 14 is then formed in the recessed groove 133A to cover the first chip-edge surface 1231 of the LED semiconductor chip 12 and cover the chip-upper surface 121 of the LED semiconductor chip 12 and the package-upper surface 131 of the packaging structure 13. Further, as shown in FIG. 6D and FIG. 6E, the light-transmitting element 13B of each of the linear light-emitting devices 10C, the reflective structure 14, and the submount substrate 11 thereof are partially removed along the horizontal direction $D_1$ according to the dashed line in FIG. 6D so that the two linear light-emitting devices 10C are separated from each other to complete the fabrication of the linear light-emitting device 10C.

Figure 7A:
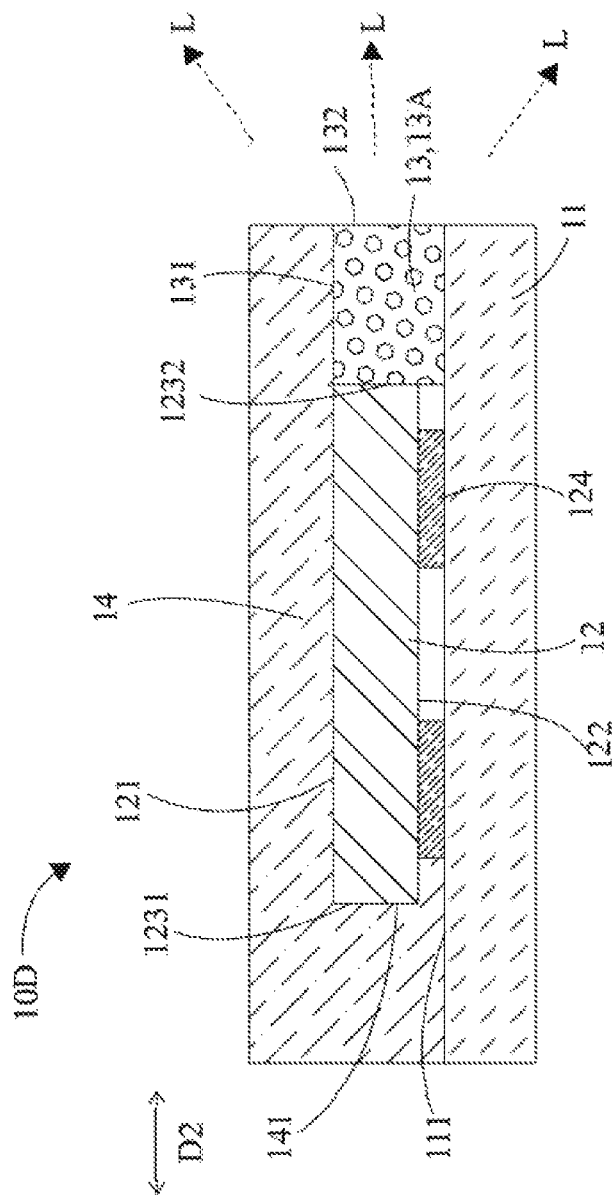
FIG. 7A and FIG. 7B are a side view and a cross-sectional view, respectively, of a chip-scale linear light-emitting device according to a fourth embodiment of the present disclosure.
Figure 7B:
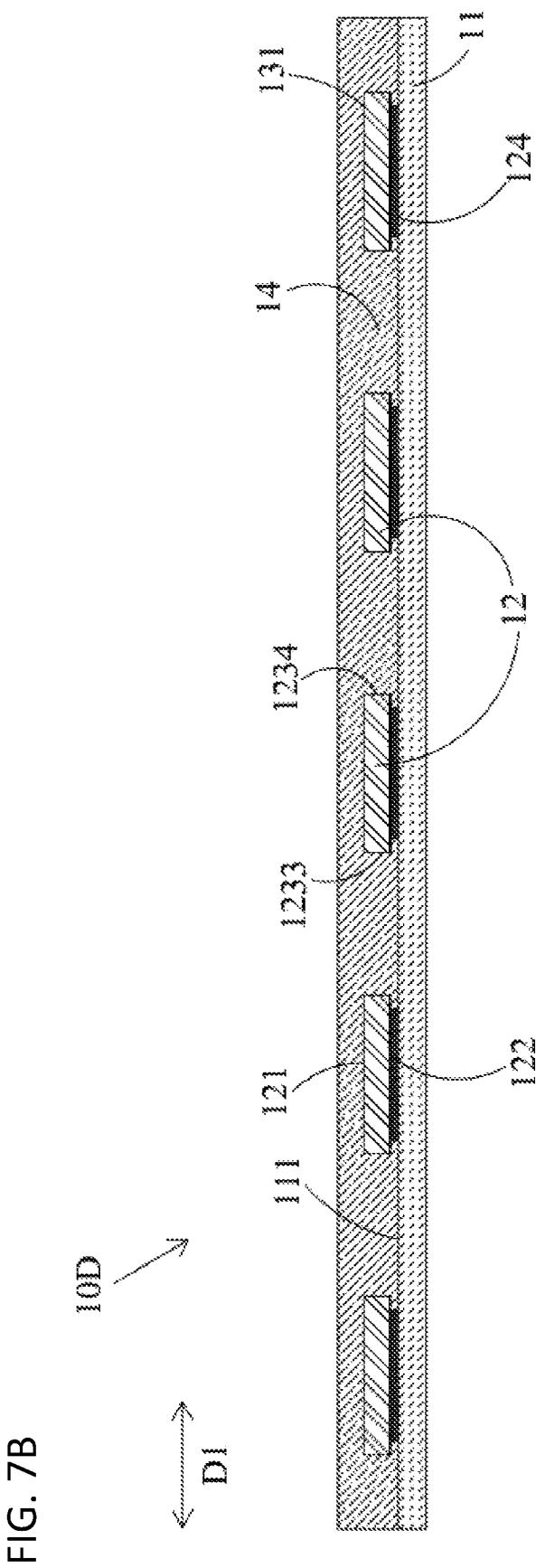

As illustrated in FIG. 7A and FIG. 7B are a side cross-sectional view and a front cross-sectional view, respectively, of a chip-scale linear light-emitting device 10D according to a fourth embodiment of the present disclosure. Similar to the linear light-emitting devices 10A and 10C, the linear light-emitting device 10D is configured to provide a mixed light beam such as white light, except that the reflective structure 14 of the linear light-emitting device 10D directly covers the third chip-edge surface 1233 and the fourth chip-edge surface 1234 of the LED semiconductor chips 12, as well as directly covers the first chip-edge surfaces 1231 of the LED semiconductor chips 12. In other words, except for the second chip-edge surface 1232 (and the lower electrode surface), the other chip-edge surfaces of the LED semiconductor chip 12 are directly covered by the reflective structure 14, whereas the second chip-edge surface 1232 is directly covered by the packaging structure 13 (e.g., the photoluminescent element 13A, the light-transmitting element 13B, or both).

Figure 8A:
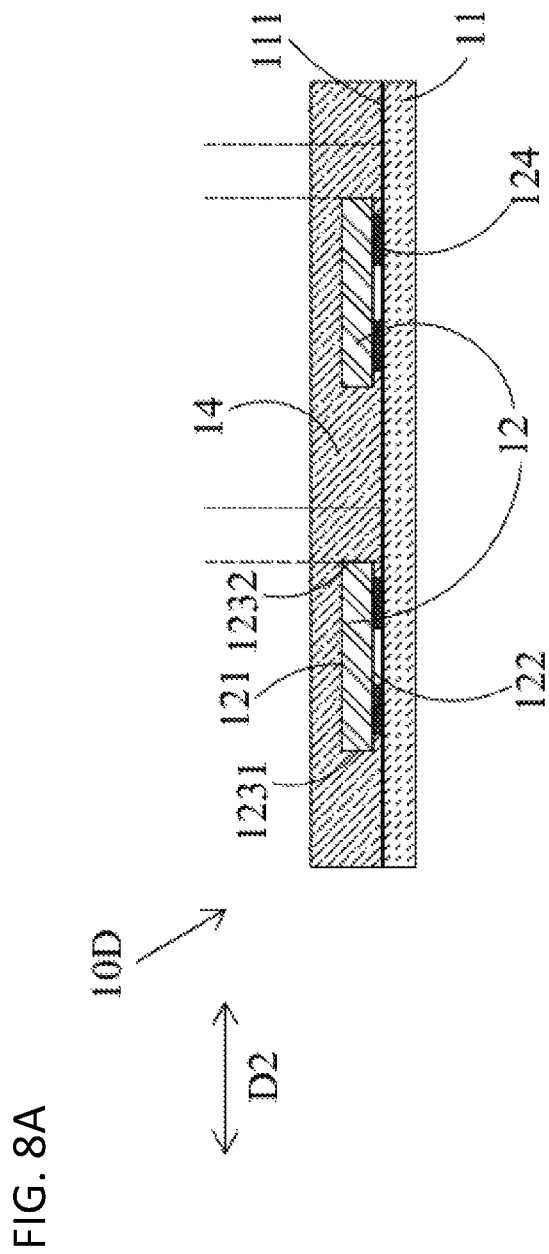
Figure 8B:
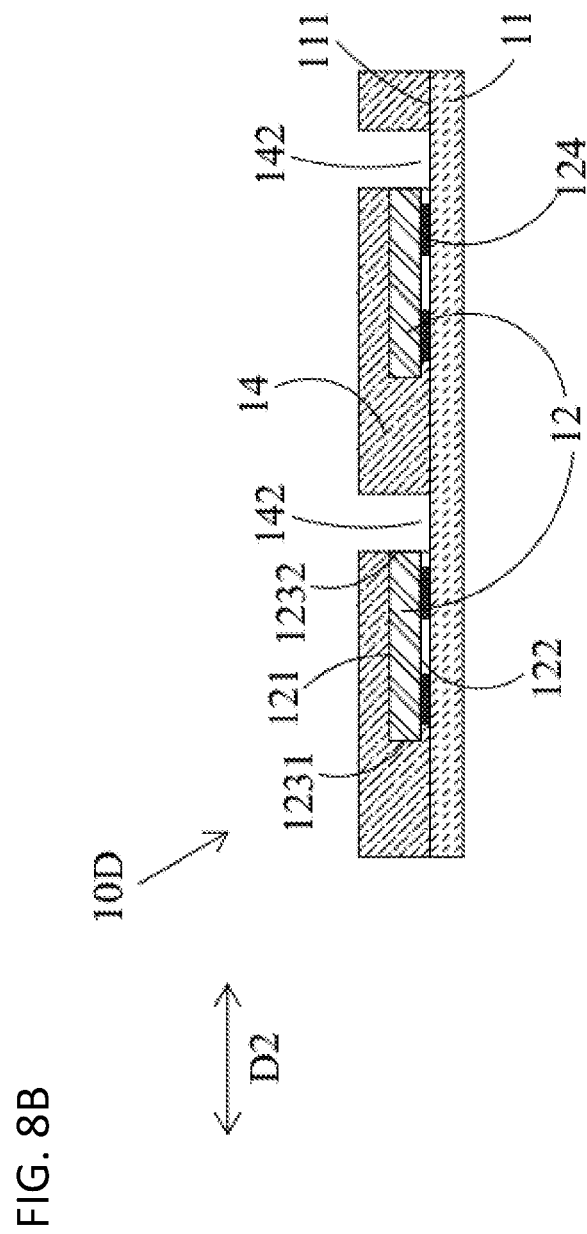
Figure 8C:
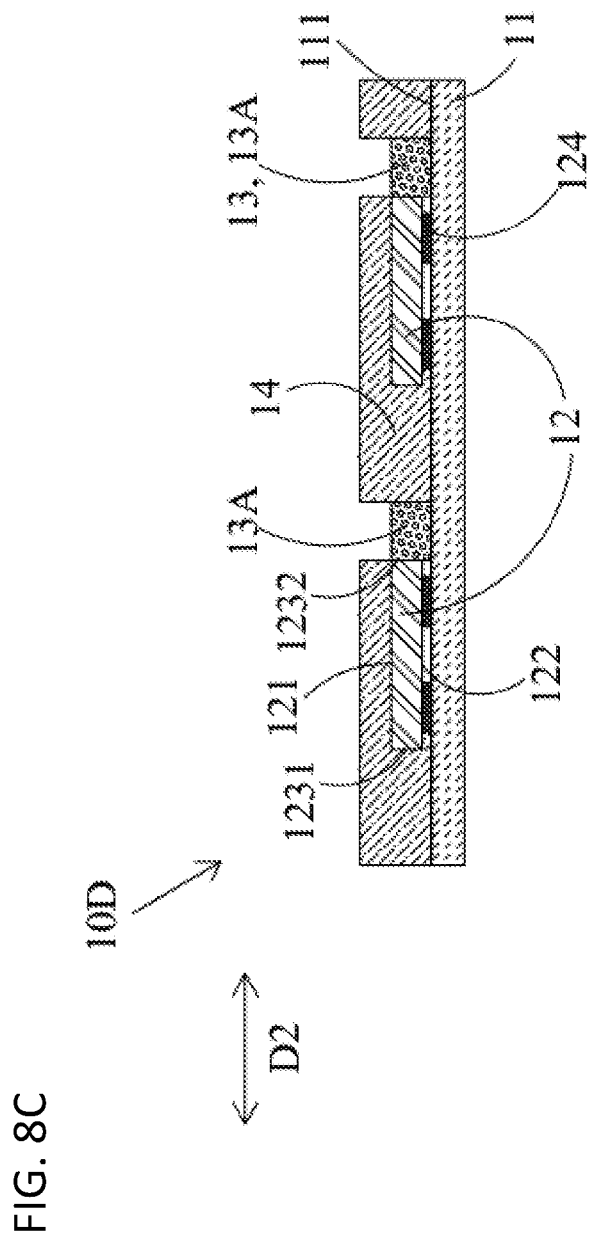

As shown from FIG. 8A to FIG. 8D, a fabricating method of the linear light-emitting device 10D is described. The main differences of this fabricating method from those of the linear light-emitting devices 10A, 10B, and 10C are as follows. As shown in FIG. 8A, after the LED semiconductor chips 12 are disposed on the submount substrate 11, the reflective structure 14 is first formed on the submount substrate 11 to cover the LED semiconductor chips 12. Then, as shown in FIG. 8B, the reflective structure 14 adjacent to the chip-edge surface 1232 of the LED semiconductor chip 12 is partially removed along the horizontal direction $D_1$ to form a recessed groove 142, and the second chip-edge surface 1232 is completely exposed to the recessed groove 142. That is, the second chip-edge surface 1232 is one of the two edge surfaces of the recessed groove 142. Next, as shown in FIG. 8C, the packaging structure 13 is formed in the recessed groove 142, and the formed packaging structure 13 directly covers the second chip-edge surface 1232, and the package-top surface 131 thereof is not lower than the chip-upper surface 121 of the LED semiconductor chip 12, and the two surfaces can be substantially flush in height. In other words, the formed packaging structure 13 does not fill up the recessed groove 142.

As shown in FIG. 8D, a portion of the reflective structure 14 is again formed on the package-top surface 131 of the packaging structure 13 to fill up the recessed groove and so that the package-top surface 131 of the packaging structure 13 is not exposed. The portion formed can be substantially flush as the previously formed portion of the reflective structure 14. Finally, the reflective structure 14 adjacent to the light-emitting side surface 132 of the packaging structure 13 and the corresponding portion of the submount substrate 11 may be partially removed along the horizontal direction $D_1$ according to the dashed line shown in FIG. 8D to fabricate the linear light-emitting device 10D.

The chip-scale linear light-emitting devices according to the embodiments 10A to 10D of the present disclosure are side-view type chip-scale linear light-emitting devices. The chip-scale linear light-emitting devices according to other embodiments of the present disclosure can be top-view type linear light-emitting devices.

Figure 9A:
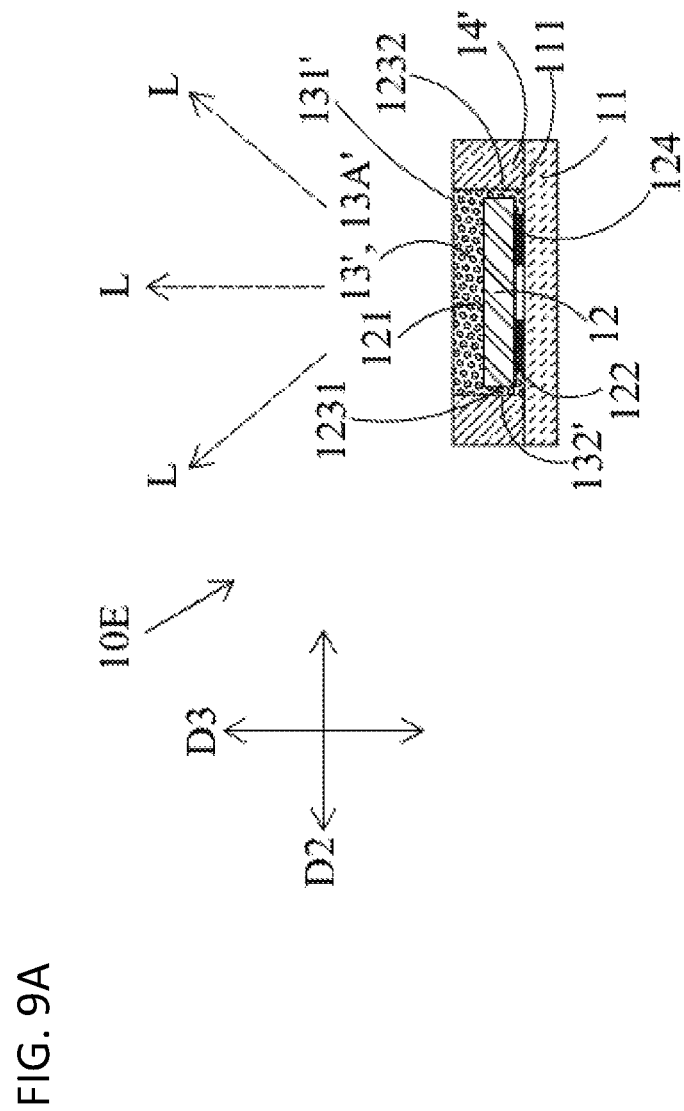
FIG. 9A, FIG. 9B, and FIG. 9C are a top view, a side view and a cross-sectional view, respectively, of a chip-scale linear light-emitting device according to a fifth embodiment of the present disclosure.
Figure 9B:
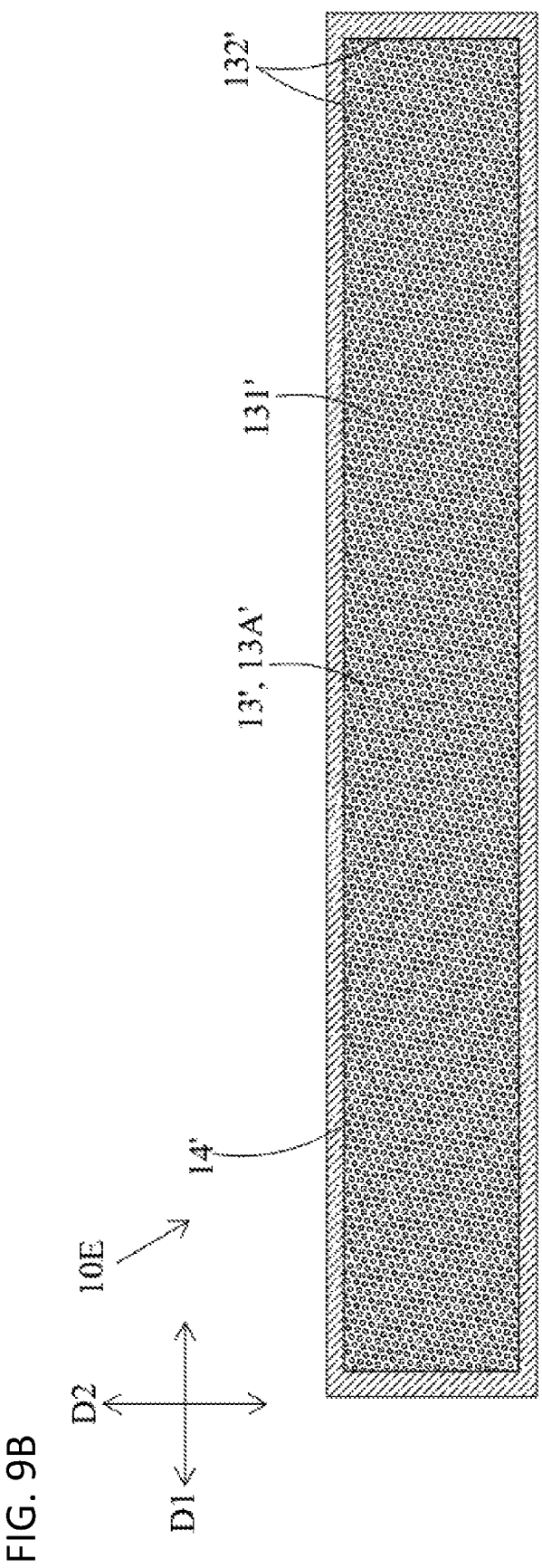
Figure 9C:
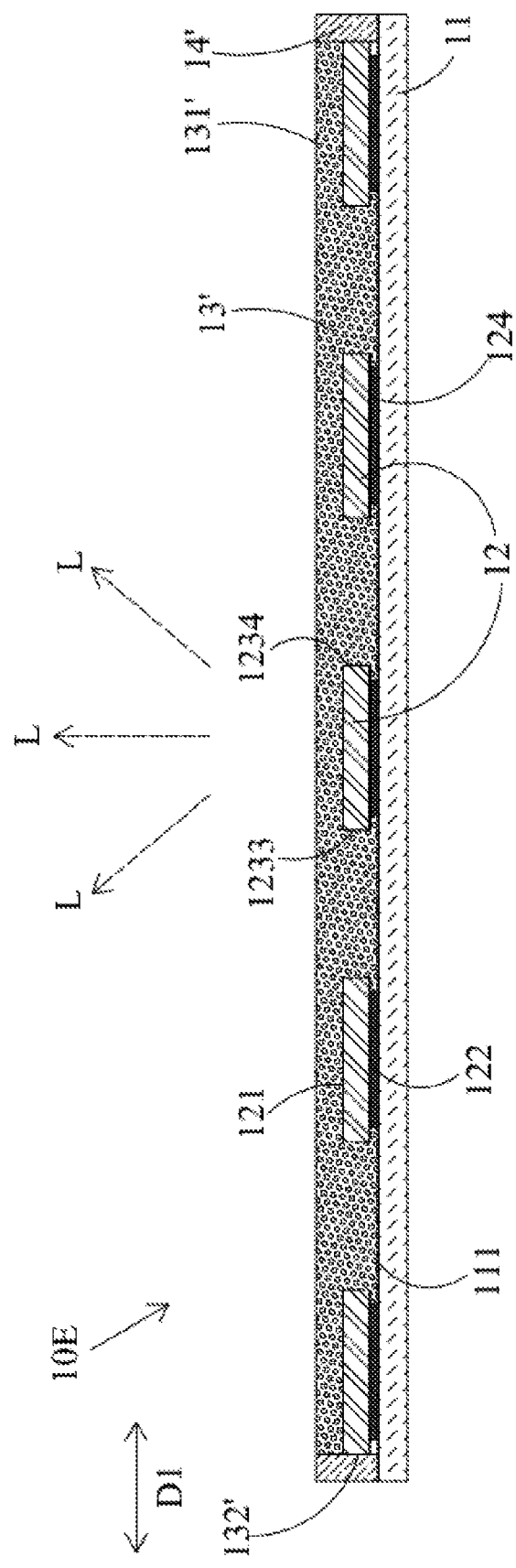

As illustrated in FIG. 9A, FIG. 9B and FIG. 9C are a side cross-sectional view, a top view, and a front cross-sectional view, respectively, of a chip-scale linear light-emitting device 10E according to a fifth embodiment of the present disclosure. Similar to the above-described linear light-emitting devices 10A to 10D, the linear light-emitting device 10E also includes a submount substrate 11 and a plurality of LED semiconductor chips 12 disposed on the submount substrate 11, except that the linear light-emitting device 10E includes other configurations of a chip-scale packaging structure 13' and a reflective structure 14'.

Specifically, the packaging structure 13' is disposed on the substrate-top surface 111 of the submount substrate 11 and covers the chip-upper surfaces 121 of the LED semiconductor chips 12. In other words, along the normal direction $D_3$ of the substrate-top surface 111 of the submount substrate 11, the submount substrate 11, the LED semiconductor chips 12 and the packaging structure 13' are sequentially disposed in a stack. The packaging structure 13' can be specified to further cover the chip-edge surfaces 1231, 1232, 1233 and 1234 of the LED semiconductor chip 12. The packaging structure 13' includes a main light-emitting top surface 131' (which may be referred to as a light-emitting top surface 131') and a plurality of package-side surfaces 132'. The primary light generated from the LED semiconductor chip 12 and the converted secondary light are radiated from the light-emitting top surface 131' out of the packaging structure 13', not from the package-side surfaces 132'. The light-emitting top surface 131' is not smaller than the entire top surface of the LED semiconductor chips array, so that the shape of the light-emitting top surface 131' can be an elongated rectangle. Along the horizontal direction $D_1$, the light-emitting top surface 131' is disposed substantially in parallel with the chip-upper surfaces 121 of the LED semiconductor chips 12, and is also disposed substantially in parallel with the electrodes 124 of the LED semiconductor chips 12 (and the chip-lower surfaces 122). Along the normal direction $D_3$, the light-emitting top surface 131' is spaced apart from the substrate-top surface 111 of the submount substrate 11, and the light-emitting top surface 131', the chip-upper surfaces 121, and the electrodes 124 of the LED semiconductor chips 12 (and the chip-lower surfaces 122) are disposed opposite to or facing one another.

Figure 9D:
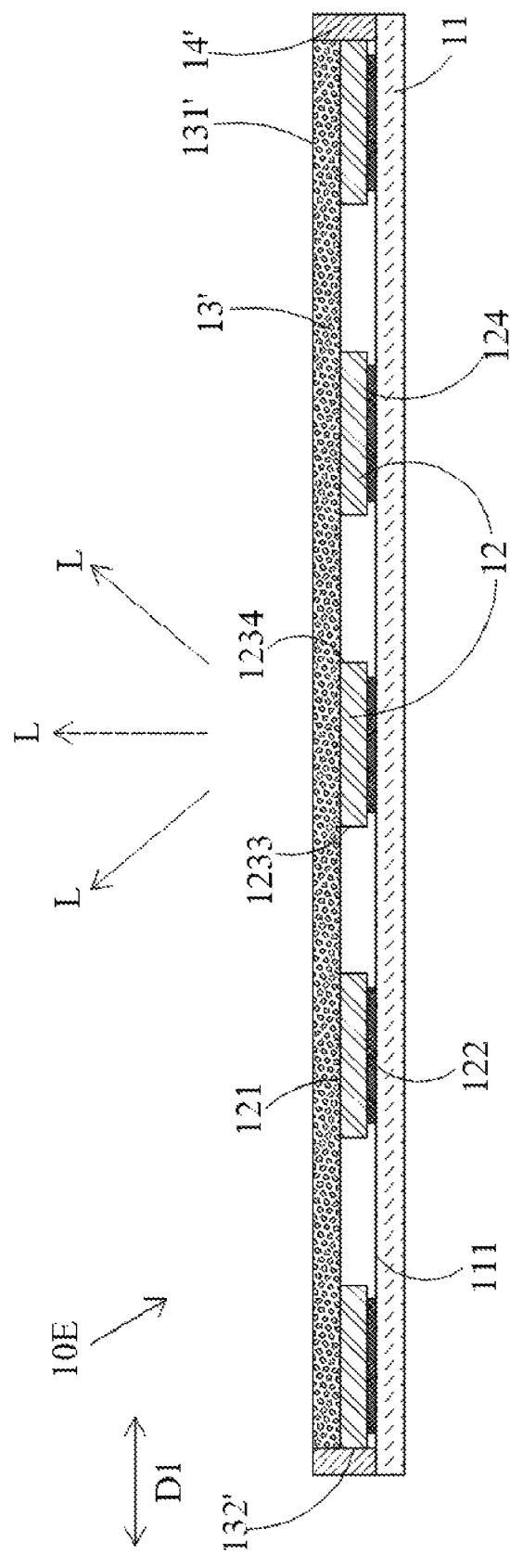
FIG. 9D is a cross-sectional view showing another variant embodiment of the chip-scale linear light-emitting device according to the fifth embodiment of the present disclosure.

The packaging structure 13' may be, or may include, a photoluminescent element 13A' directly covering the chip-upper surface 121 of the LED semiconductor chip 12 and the chip-edge surfaces 1231, 1232, 1233 and 1234. In another variant embodiment as shown in FIG. 9D, the packaging structure 13' can be a photoluminescent layer. In contrast to the photoluminescent element 13A', which is formed directly on the submount substrate 11, the photoluminescent layer is pre-formed and then disposed (e.g., laminated) on the chip-upper surfaces 121 of the LED semiconductor chips 12. Thus, with this configuration, the photoluminescent layer covers the chip-upper surfaces 121, but does not cover the chip-edge surfaces 1231, 1232, 1233 and 1234 of the LED semiconductor chips 12.

The reflective structure 14' is disposed on the substrate-top surface 111 of the submount substrate 11, and covers the package-side surfaces 132' and the chip-edge surfaces 1231, 1232, 1233 and 1234 along the horizontal direction $D_1$ and the horizontal direction $D_2$. However, the light-emitting top surface 131' and the chip-upper surface of the LED semiconductor chip 12 are exposed from the reflective structure 14'. In other words, as shown in FIG. 9B, the reflective structure 14' appears as a reflective wall surrounding the LED semiconductor chips 12 and the packaging structure 13' to cover the chip-edge surfaces 1231, 1232, 1233 and 1234 and the package-side surfaces 132'.

Thereby, the primary light emitted toward the chip-edge surfaces 1231, 1232, and 1234 of the LED semiconductor chip 12 can be reflected back by the reflective structure 14' and is finally guided toward and escapes from the light-emitting top surface 131', which is not covered by the reflective structure 14'. It can be seen that the linear light-emitting device 10E mainly radiates the light beam L from the light-emitting top surface 131' of the packaging structure 13'. Compared to the linear light-emitting devices 10A to 10D, wherein the main light-emitting side surface 132 is disposed substantially perpendicular to the set of electrodes 124 of the LED semiconductor chip 12, the light-emitting top surface 131' is disposed substantially in parallel with the set of electrodes 124 of the LED semiconductor chip 12. Therefore, the linear light-emitting device 10E is a top-view type linear light-emitting device. In addition, the reflective structure 14' can guide a portion of the primary light to emit toward the optical cavity between the third chip-edge surface 1233 and the fourth chip-edge surface 1234 of the two adjacent LED semiconductor chips 12, and emit toward the area of the light-emitting top surface 131' between the third chip-edge surface 1233 and the fourth chip-edge surface 1234 of the two adjacent LED semiconductor chips 12. In other words, the light-emitting top surface 131' can have a uniformly radiated light beam L to form a light source with a linearly distributed radiation pattern.

Figure 9E:
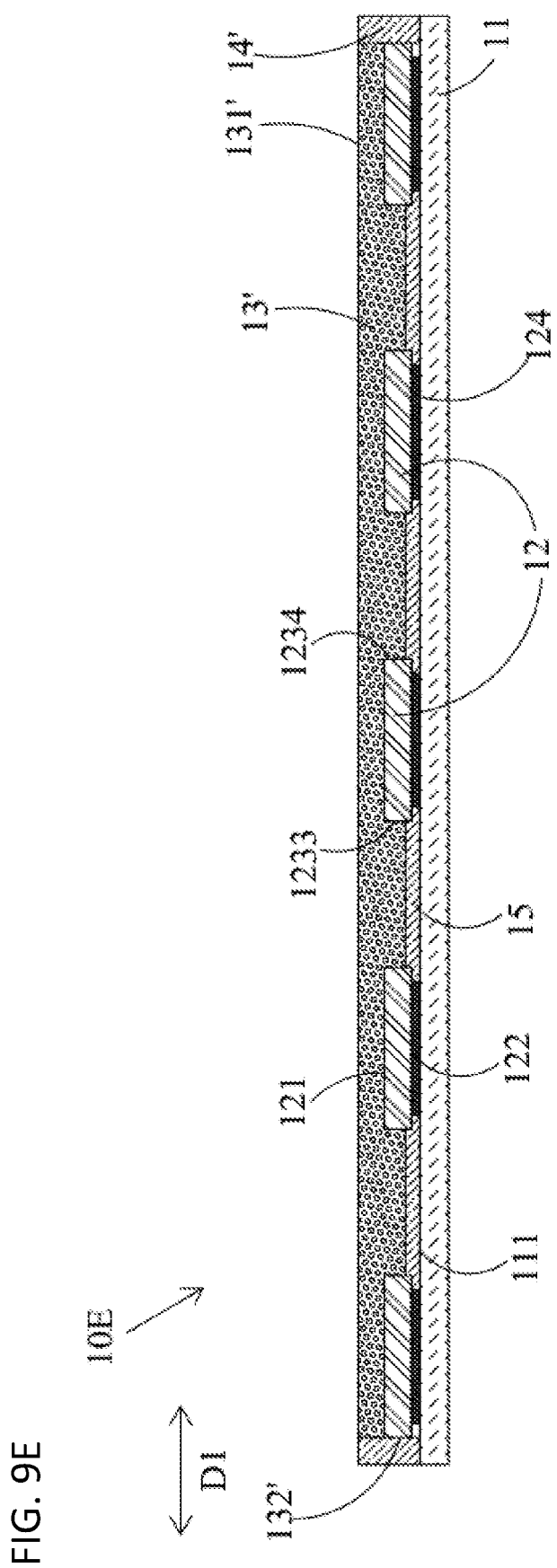
FIG. 9E is a cross-sectional view showing another variant embodiment of the chip-scale linear light-emitting device according to the fifth embodiment of the present disclosure.

As illustrated in FIG. 9E, in another variant embodiment, the linear light-emitting device 10E can include a reflective layer 15 disposed on the substrate-top surface 111 of the submount substrate 11 without affecting the electrical connectivity between the set of electrodes 124 of the LED semiconductor chip 12 and the bonding pads of the submount substrate 11 (not shown), and may partially cover the chip-edge surfaces 1231, 1232, 1233 and 1234 of the LED semiconductor chip 12. The packaging structure 13' is integrally disposed on the reflective layer 15, and the light-emitting top surface 131' is configured to be substantially in parallel with and spaced apart from the reflective layer 15. Alternatively, the reflective structure 14' may be connected to the reflective layer 15 to form an optical cavity. Thereby, the reflective layer 15 can effectively guide the primary light emitted from the LED semiconductor chip 12 to the packaging structure 13' to increase the luminous efficiency, wherein a portion of the primary light can be converted into a secondary light and can escape from the light-emitting top surface 131'.

Figure 10A:
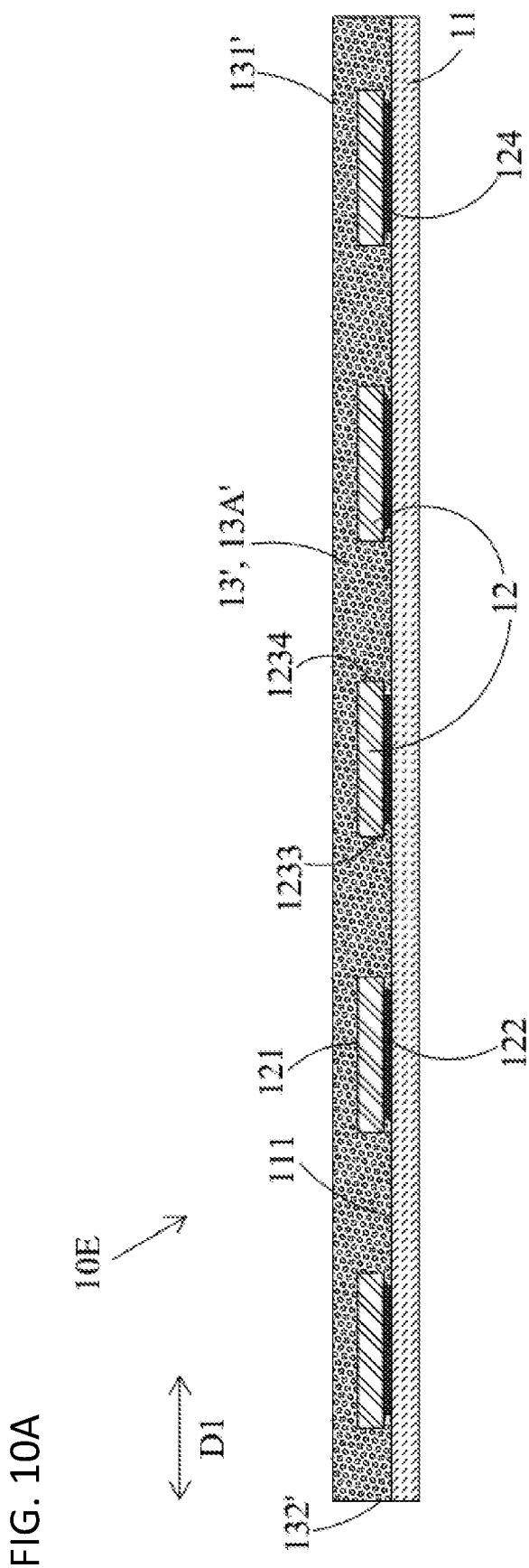
FIG. 10A, FIG. 10B, and FIG. 10C are schematic views showing the fabricating stages of the chip-scale linear light-emitting device shown in FIG. 9A.
Figure 10B:
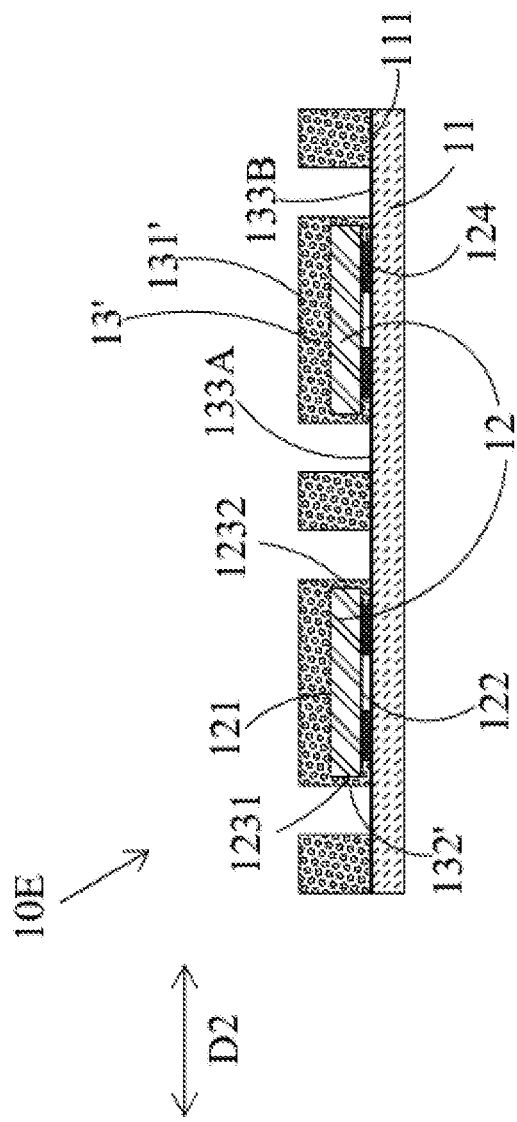

As illustrated from FIG. 10A to FIG. 10C, a method of fabricating the linear light-emitting device 10E will be described. As shown in FIG. 10A, after the plurality of the LED semiconductor chips 12 are disposed on the submount substrate 11, the packaging structure 13' (for example, the photoluminescent element 13A') is formed on the submount substrate 11 to cover the LED semiconductor chips 12. Then, as shown in FIG. 10B, two portions of the packaging structure 13' are partially removed along the horizontal direction $D_1$ to form a recessed groove 133A adjacent to the first chip-edge surface 1231 and another recessed groove 133B adjacent to the second chip-edge surface 1232. When the portions of the packaging structure 13' adjacent to the first chip-edge surface 1231 and the second chip-edge surface 1232 are partially removed, these portions adjacent to the first chip-edge surface 1231 and the second chip-edge surface 1232 can be completely removed, or a small amount of the packaging structure 13' can be retained.

Figure 10C:
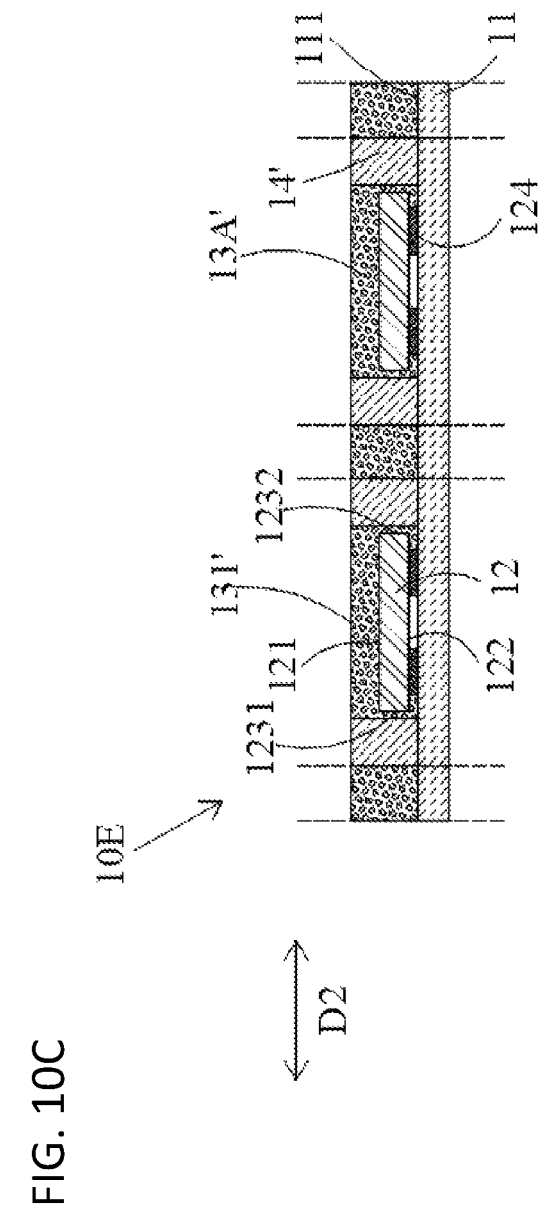

As shown in FIG. 10C, after the recessed grooves 133A, 133B are formed, the reflective structure 14' is formed in the recessed grooves 133A, 133B to cover the first and the second chip-edge surfaces 1231, 1232 of the LED semiconductor chip 12. The top surface of the reflective structure 14' is formed to be substantially flush with the light-emitting top surface 131' of the packaging structure 13' (the top surface of the reflective structure 14' may also be slightly higher or lower than the light-emitting top surface 131' of the packaging structure 13'). Finally, the packaging structure 13' of each of the linear light-emitting devices 10E and the underlying submount substrate 11 are partially removed along the horizontal direction $D_1$ according to the dotted line in FIG. 10C, so that the linear light-emitting devices 10E are singulated and separated to complete fabrication of the chip-scale linear light-emitting devices 10E.

Figure 11A:
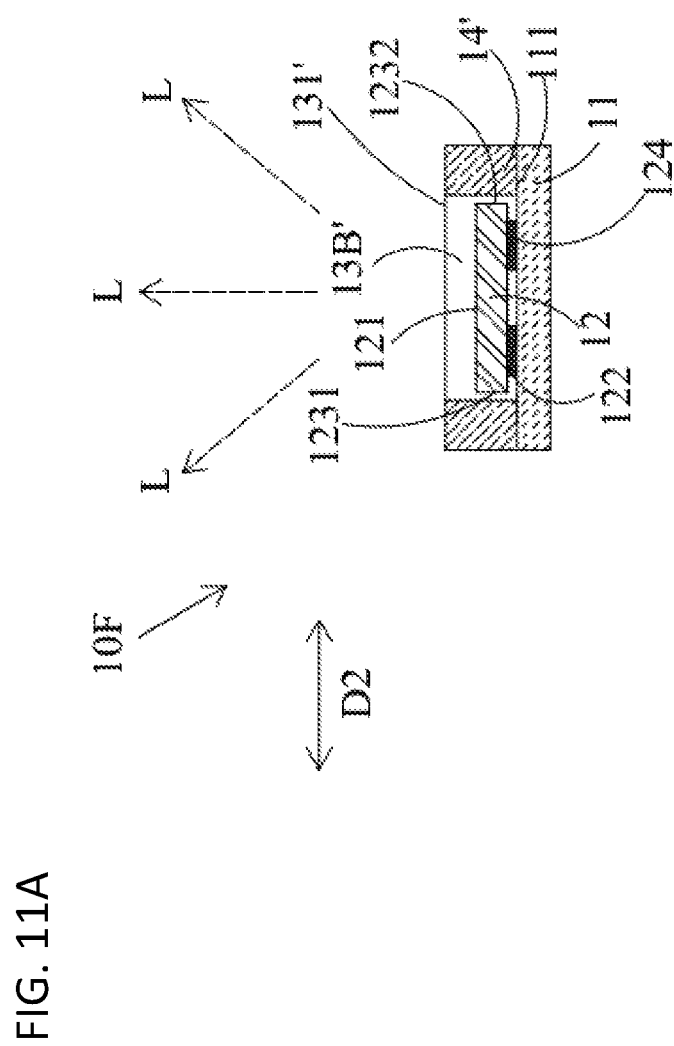
FIG. 11A, FIG. 11B, and FIG. 11C are a side view, a top view and a cross-sectional view, respectively, of a chip-scale linear light-emitting device according to a sixth embodiment of the present disclosure.
Figure 11B:
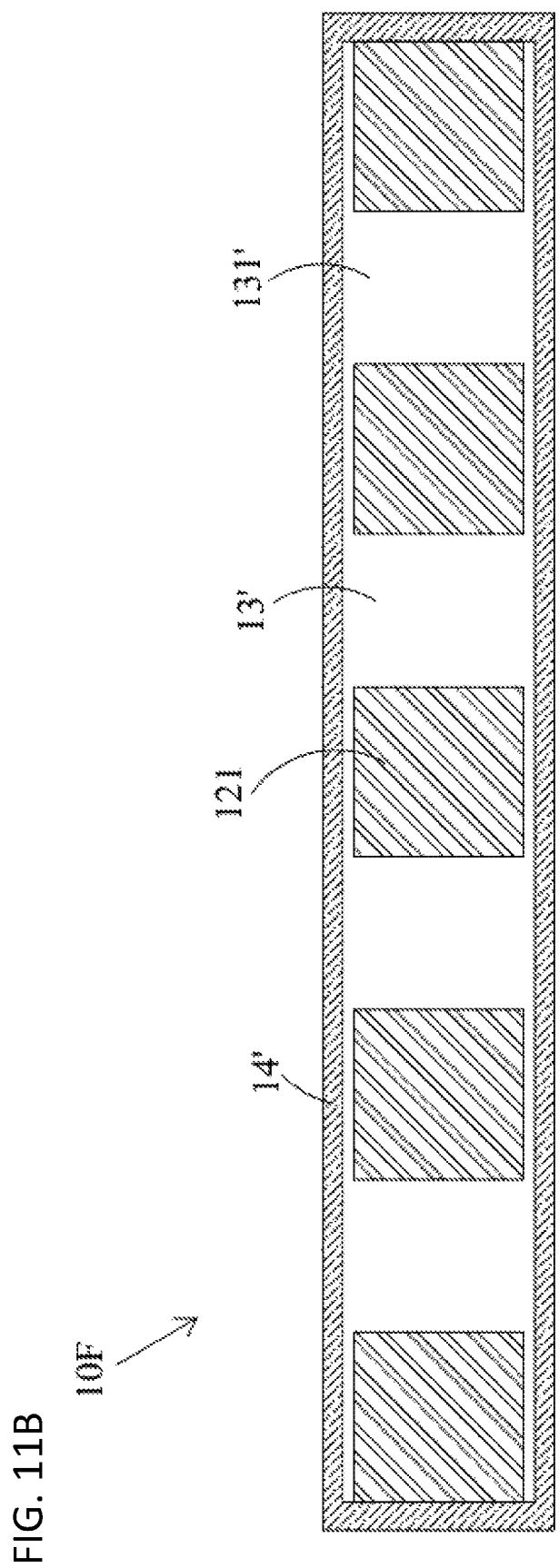
Figure 11C:
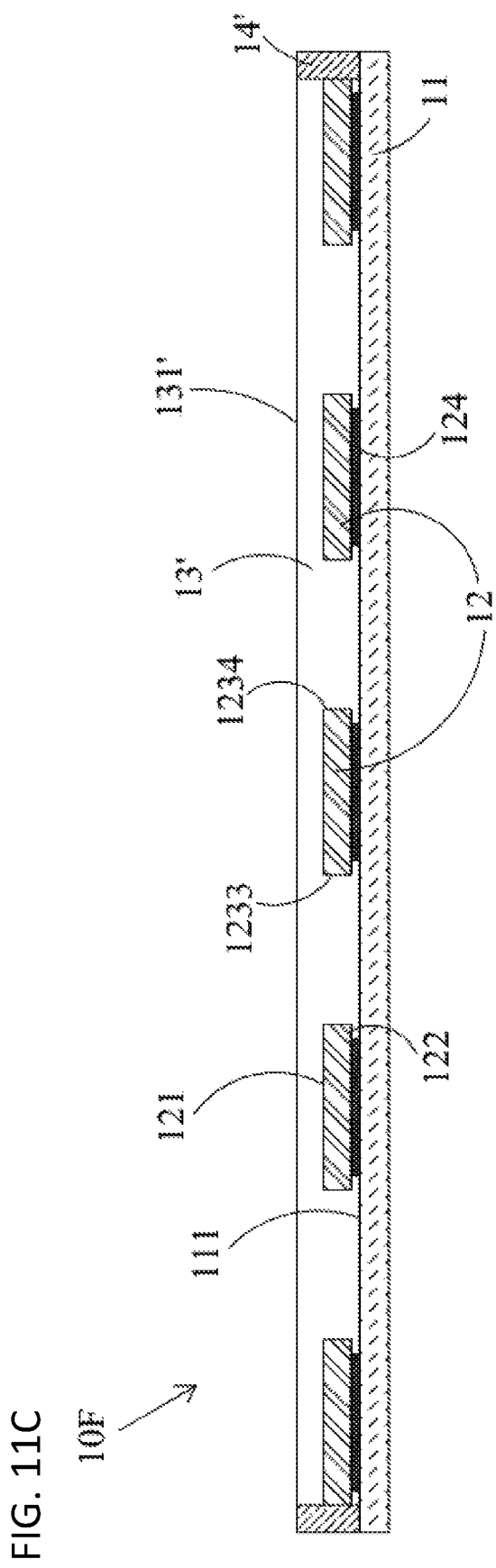

As shown from FIG. 11A to FIG. 11C are a side cross-sectional view, a top view, and a front cross-sectional view, respectively, of a chip-scale linear light-emitting device 10F according to a sixth embodiment of the present disclosure. Similar to the above-described linear light-emitting device 10E, the light beam L is radiated from the light-emitting top surface 131' of the packaging structure 13'. Therefore, the linear light-emitting device 10F is also a top-view type linear light-emitting device. The difference of the linear light-emitting device 10F compared with the above-described linear light-emitting devices is that the packaging structure 13' is a light-transmitting element 13B', wherein the light-transmitting element 13B' can cover the chip-edge surfaces 1231, 1232, 1233 and 1234 and the chip-upper surface 121 of the LED semiconductor chip 12. Therefore, as shown in FIG. 11B, the chip-upper surfaces 121 of the LED semiconductor chips 12 of the linear light-emitting device 10F are visible from the top view. In other variant embodiments (not shown), the height of the light-emitting top surface 131' of the packaging structure 13' may be substantially flush with the height of the chip-upper surface 121. In other words, the light-transmitting element 13B' may not cover the chip-upper surface 121.

Thereby, the linear light-emitting device 10F can be used to provide a top-view type linear light source of various monochromatic lights such as red light, green light, blue light, infrared light or ultraviolet light, wherein the light is emitted from the light-emitting top surface 131' with a linearly distributed light radiation pattern.

Figure 12:
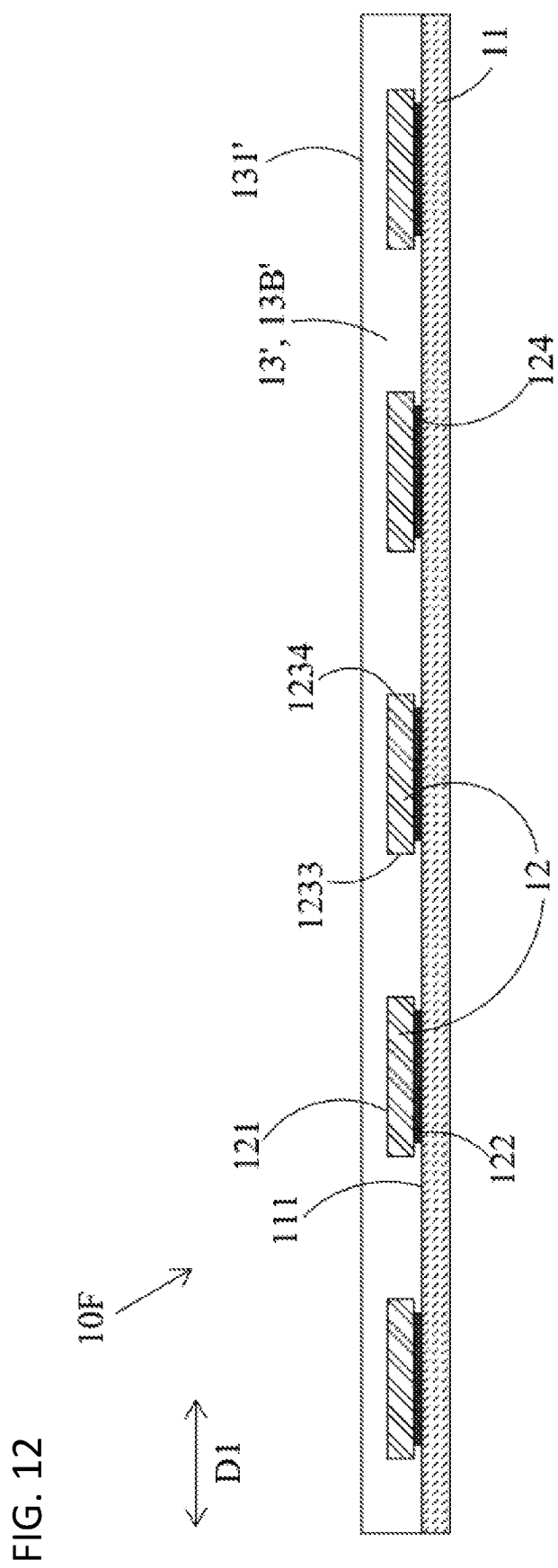
FIG. 12 is a schematic view showing the fabricating stages of the chip-scale linear light-emitting device shown in FIG. 11A.

As illustrated in FIG. 12, a method of fabricating the linear light-emitting device 10F will be described. The fabricating method is similar to that of the linear light-emitting device 10E, except that when the packaging structure 13' is formed on the submount substrate 11, the composition material of the packaging structure 13 does not include a photoluminescent material, so that the formed packaging structure 13' is, or includes, a light-transmitting element 13B'.

Figure 13A:
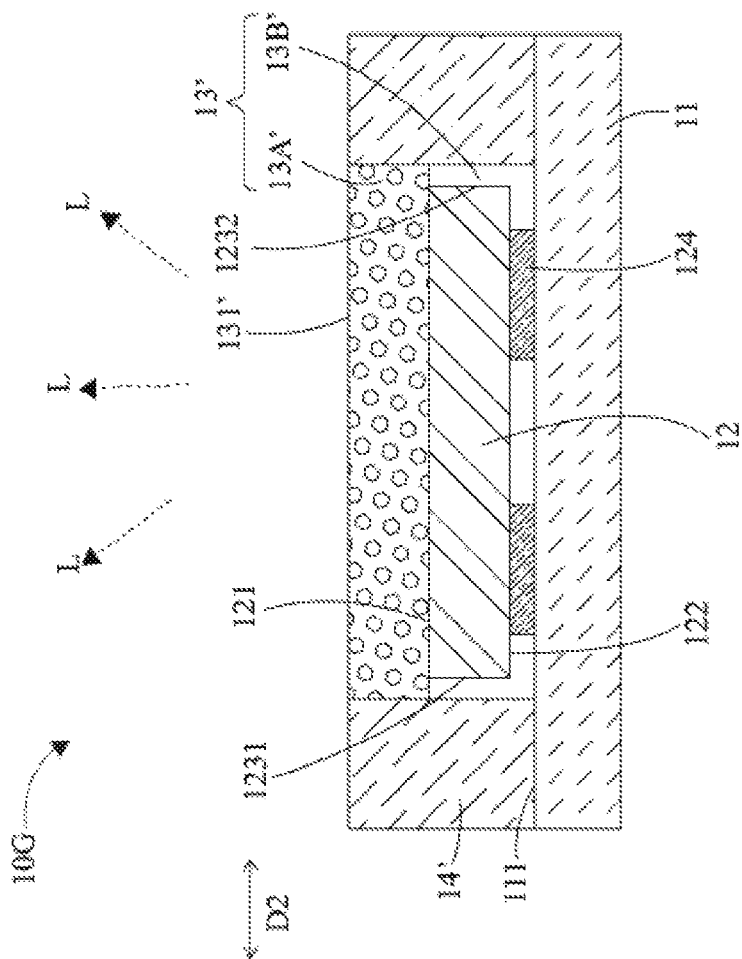
FIG. 13A and FIG. 13B are two cross-sectional views of a chip-scale linear light-emitting device according to a seventh embodiment of the present disclosure.
Figure 13B:
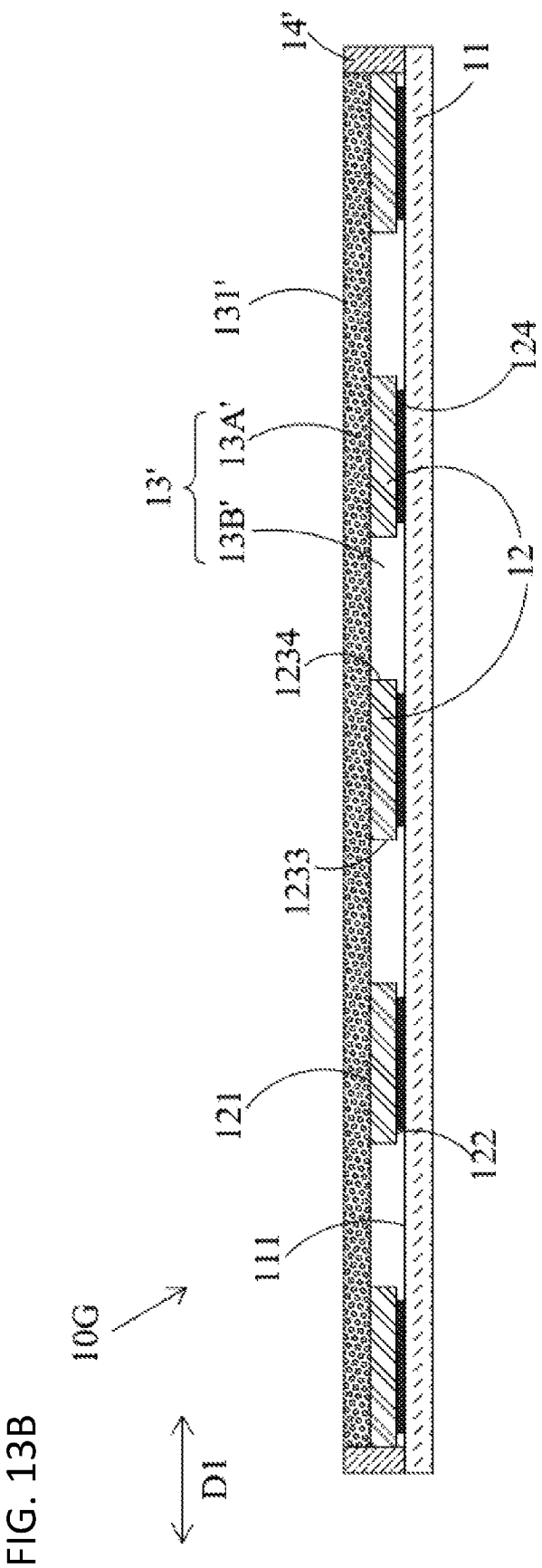

Next, as shown in FIG. 13A and FIG. 13B are a side cross-sectional view and a front cross-sectional view, respectively, of a chip-scale linear light-emitting device 10G according to a seventh embodiment of the present disclosure. Similar to the above-described linear light-emitting devices 10E and 10F, the light beam L of the linear light-emitting device 10G is also emitted from the light-emitting top surface 131' of the packaging structure 13'. Therefore, the linear light-emitting device 10G is also a top-view type linear light-emitting device. Unlike the linear light-emitting devices 10E and 10F, the packaging structure 13' of the linear light-emitting device 10G is a stacked structure including a photoluminescent element 13A' and a light-transmitting element 13B'. The top surface of the photoluminescent element 13A' is the light-emitting top surface 131'.

Specifically, the light-transmitting element 13B' covers the chip-edge surfaces 1231, 1232, 1233 and 1234 of the LED semiconductor chip 12, and the top surface of the light-transmitting element 13B' is substantially flush with the chip-upper surfaces 121 of the LED semiconductor chips 12. Then, the photoluminescent element 13A' is disposed on the top surface of the light-transmitting element 13B' and the chip-upper surface 121 of the LED semiconductor chip 12 to cover the chip-upper surface 121 of the LED semiconductor chip 12. In other variant embodiments, the light-transmitting element 13B' may also cover the chip-upper surfaces 121 of the LED semiconductor chips 12, so that the LED semiconductor chips 12 are completely covered by the light-transmitting element 13B'.

Thereby, the primary light of the LED semiconductor chips 12 passes through the photoluminescent element 13A' to be emitted outward from the light-emitting top surface 131'. Also, the linear light-emitting device 10G can provide a light beam L such as white light by mixing the primary light and the converted secondary light.

As illustrated from FIG. 14A to FIG. 14D, a fabricating method of the above-described linear light-emitting device 10G will be described. The fabricating method is different from that of the linear light-emitting devices 10E and 10F in that the process stage of forming the packaging structure 13' includes two fabricating stages.

Figure 14A:
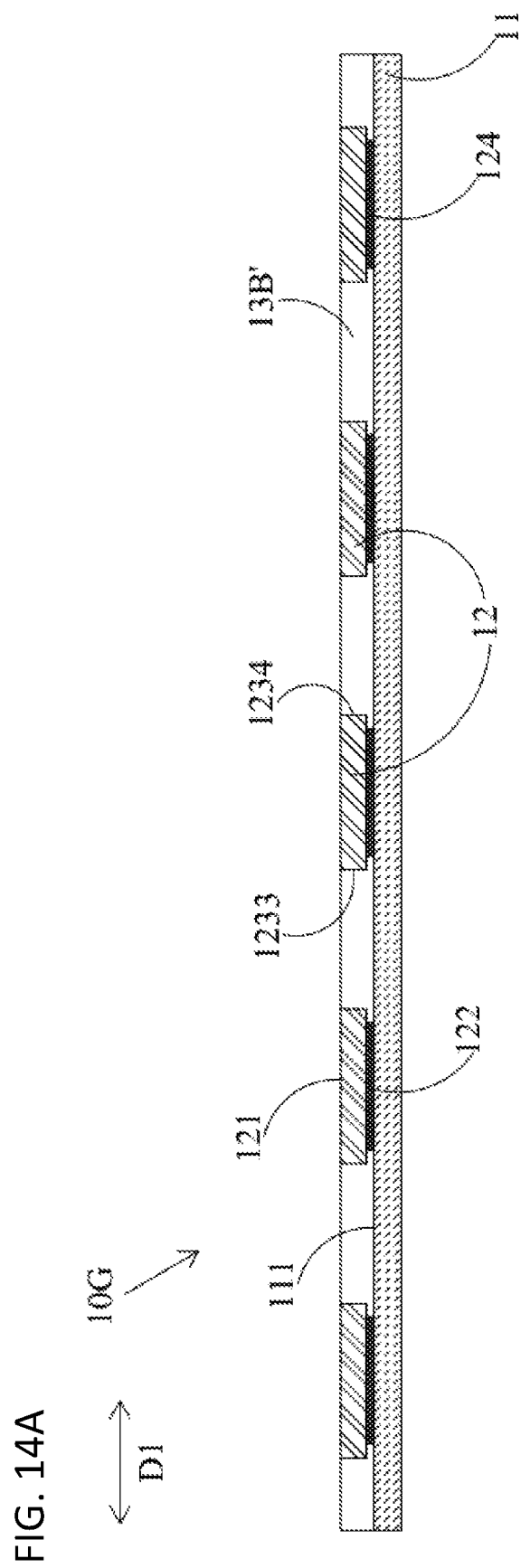
FIG. 14A, FIG. 14B, FIG. 14C, and FIG. 14D are schematic views showing the fabricating stages of the chip-scale linear light-emitting device shown in FIG. 13A.
Figure 14B:
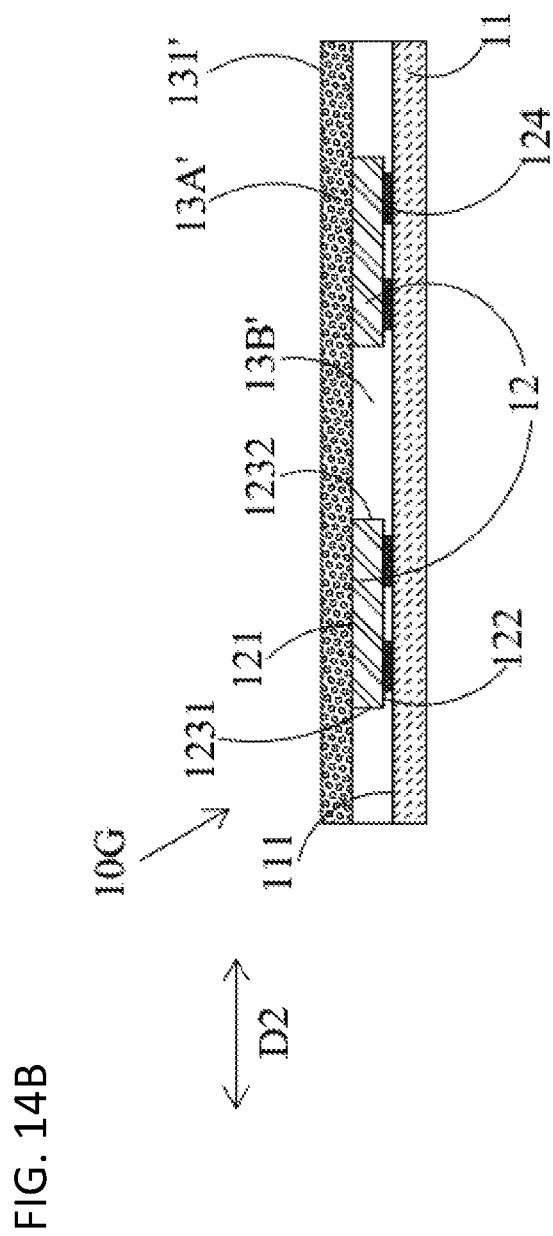
Figure 14C:
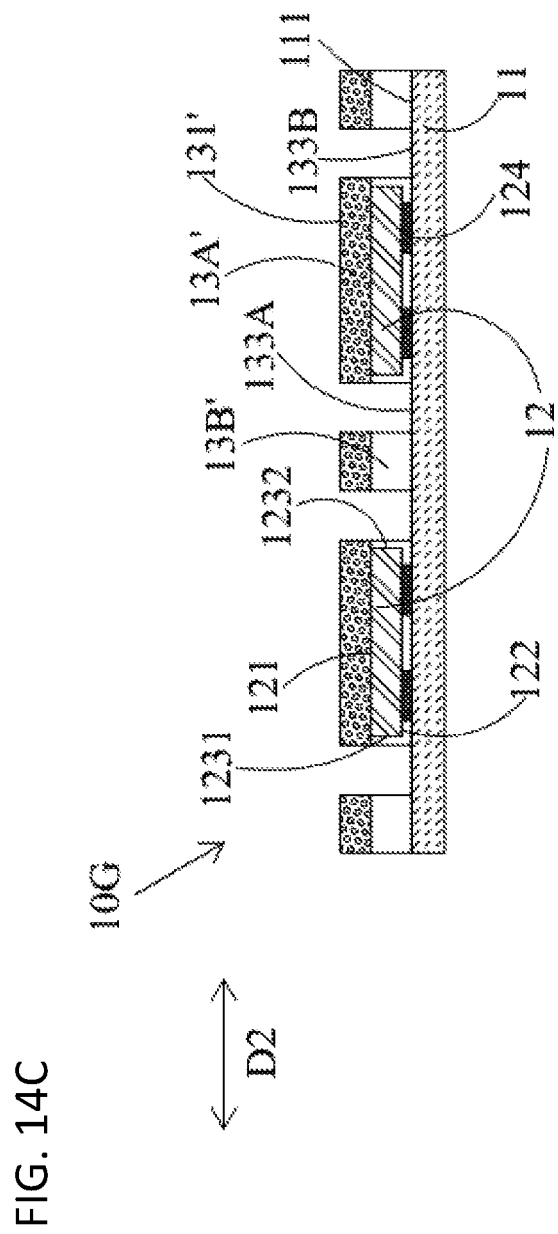
Figure 14D:
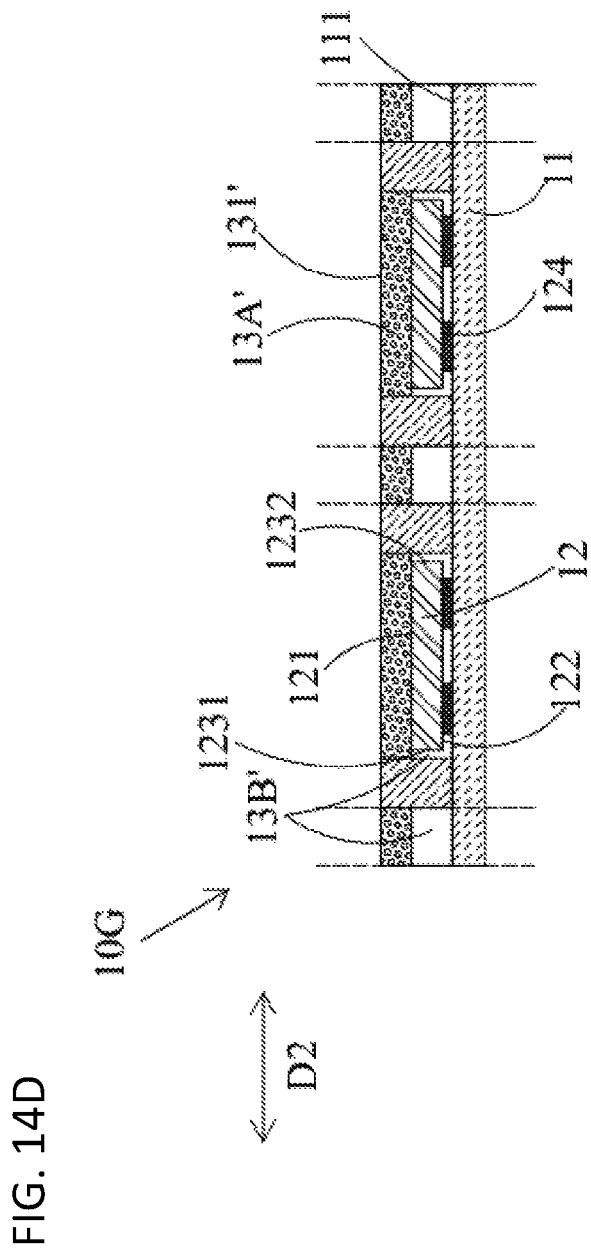

Specifically, as shown in FIG. 14A, after the LED semiconductor chips 12 are disposed on the submount substrate 11, the light-transmitting element 13B' is formed on the submount substrate 11 to cover the chip-edge surfaces 1231, 1232, 1233 and 1234 of the LED semiconductor chips 12. Then, as shown in FIG. 14B, the photoluminescent element 13A' is formed to cover the light-transmitting element 13B' and the chip-upper surfaces 121 of the LED semiconductor chips 12. As shown in FIG. 14C, two portions of the packaging structure 13' are then partially removed along the horizontal direction $D_1$ to form two recessed grooves 133A and 133B (the removed portion includes the photoluminescent element 13A' and the light-transmitting element 13B'). Finally, as shown in FIG. 14D, the reflective structure 14' is formed in the recessed grooves 133A and 133B to cover the chip-edge surfaces 1231 and 1232 of the LED semiconductor chips 12. Then, according to the dashed line of the FIG. 14D, the packaging structure 13' of the linear light-emitting devices 10G and the underlying submount substrate 11 are partially removed along the horizontal direction $D_1$, so that the linear light-emitting devices 10G are singulated and separated, and the fabrication process of the linear light-emitting device 10G is completed.

Next, a backlight module, including any of the above-described embodiments of the chip-scale linear light-emitting devices according to the present disclosure, is described. As illustrated in FIG. 15A, FIG. 15B, FIG. 16A, and FIG. 16B are backlight modules 1A and 1B of different embodiments, respectively, wherein the backlight module 1A is specified to include any one of the side-view type linear light-emitting devices 10A to 10D, and the backlight module 1B is specified to include any one of the top-view type linear light-emitting devices 10E to 10G.

Figure 15A:
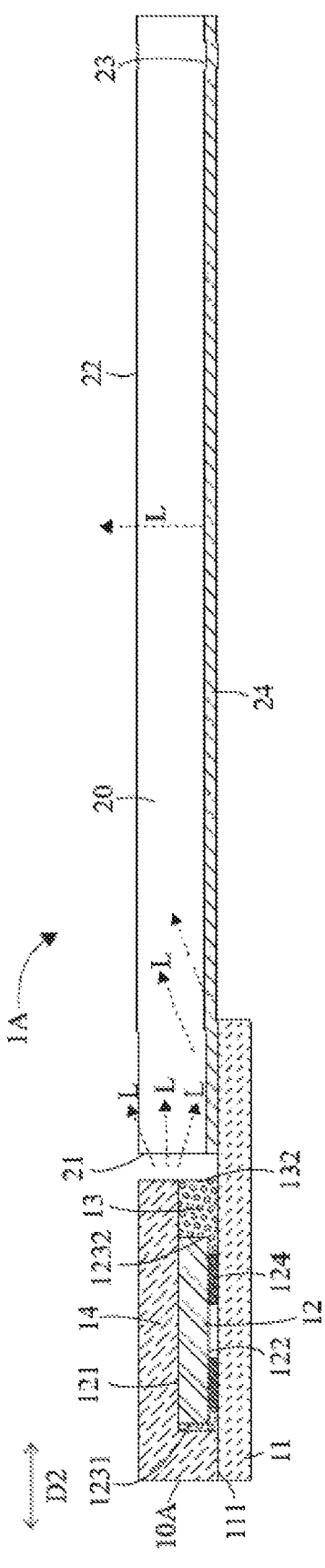
FIG. 15A and FIG. 15B are a side view and a top view, respectively, of a backlight module in accordance with an embodiment of the present disclosure.
Figure 15B:
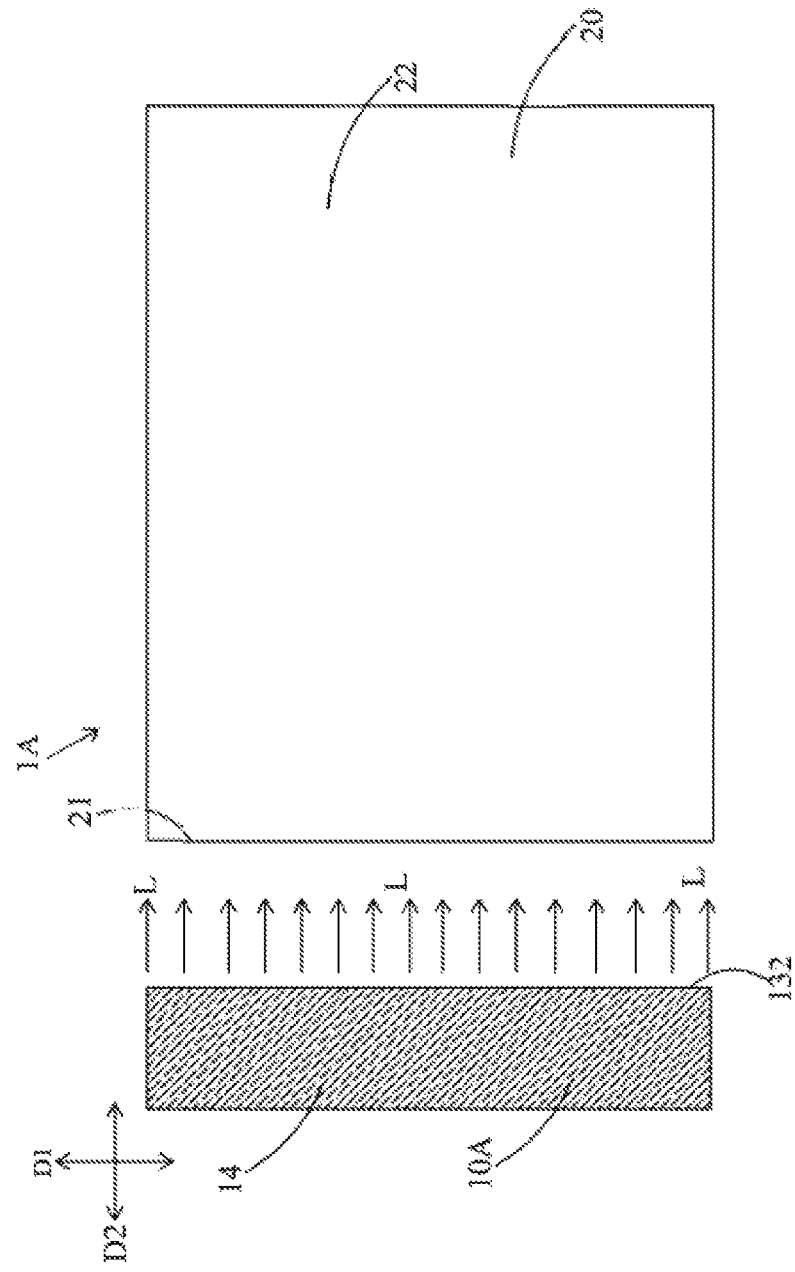

As shown in FIG. 15A and FIG. 15B, the backlight module 1A includes a side-view type linear light-emitting device (taking the linear light-emitting device 10A as an example) and a light guide plate 20. Along the second horizontal direction $D_2$, the linear light-emitting device 10A is disposed beside the light guide plate 20. The light guide plate 20 includes a light-incident surface 21, a light-exiting surface 22, a light-guide-back surface 23, and a reflective layer 24, wherein the light-incident surface 21 is disposed is substantially parallel to and facing the light-emitting side surface 132 of the linear light-emitting device 10. The light-incident surface 21 is also connected to the light-exiting surface 22 and the light-guide-back surface 23. The light-exiting surface 22 and the light-guide-back surface 23 are disposed to be spaced apart along the normal direction $D_3$ of the submount substrate 11. The reflective layer 24 is disposed on the light-guide-back surface 23, and, for example, can be made of highly reflective materials.

Thereby, the light beam L emitted from the light-emitting side surface 132 of the linear light-emitting device 10A can be transmitted to the light-incident surface 21 of the light guide plate 20, and then the light beam L can be reflected by the reflective layer of the light guide plate 20, and finally uniformly radiated from the light-exiting surface 22 to provide a uniform planar backlight source. Since the light-emitting side surface 132 of the linear light-emitting device 10A can provide a uniformly and continuously distributed linear light beam L to be transmitted to the light-incident surface 21 in the second horizontal direction $D_2$, the dark regions on the light-incident surface 21 can be reduced. Thus, the distance (light-mixing distance) between the light-incident surface 21 of the light guide plate 20 and the border of an effective display area can be made small to achieve a substantially bevel-less display.

Desirably, the area of the light-emitting side surface 132 of the linear light-emitting device 10A is not larger than the area of the light-incident surface 21 of the light guide plate 20, so that the light beam L can be effectively transmitted to the light guide plate 20 via the light-incident surface 21 without light leakage. In addition, along the horizontal direction $D_2$, the submount substrate 11 of the linear light-emitting device 10A can be extended beyond the light-emitting side surface 132 toward the light guide plate 20, so that the substrate-top surface 111 of the submount substrate 11 is larger than the reflective structure 14. The substrate-top surface 111 has an additional area for the light-guide plate 20 to be overlaid on the substrate-top surface 111, which facilitates the positioning and alignment of the linear light-emitting device 10A and the light guide plate 20 during an assembly processes.

Figure 16A:
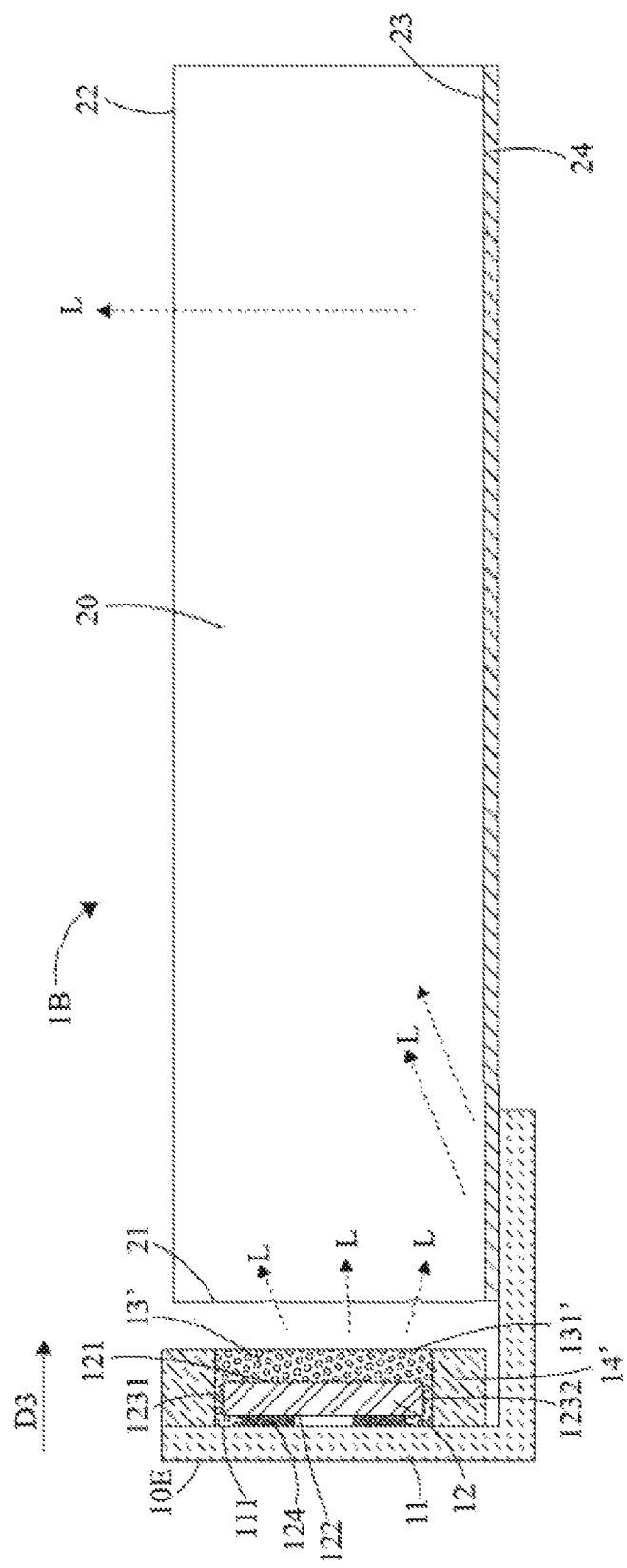
FIG. 16A and FIG. 16B are a side view and a top view, respectively, of another backlight module in accordance with another embodiment of the present disclosure.
Figure 16B:
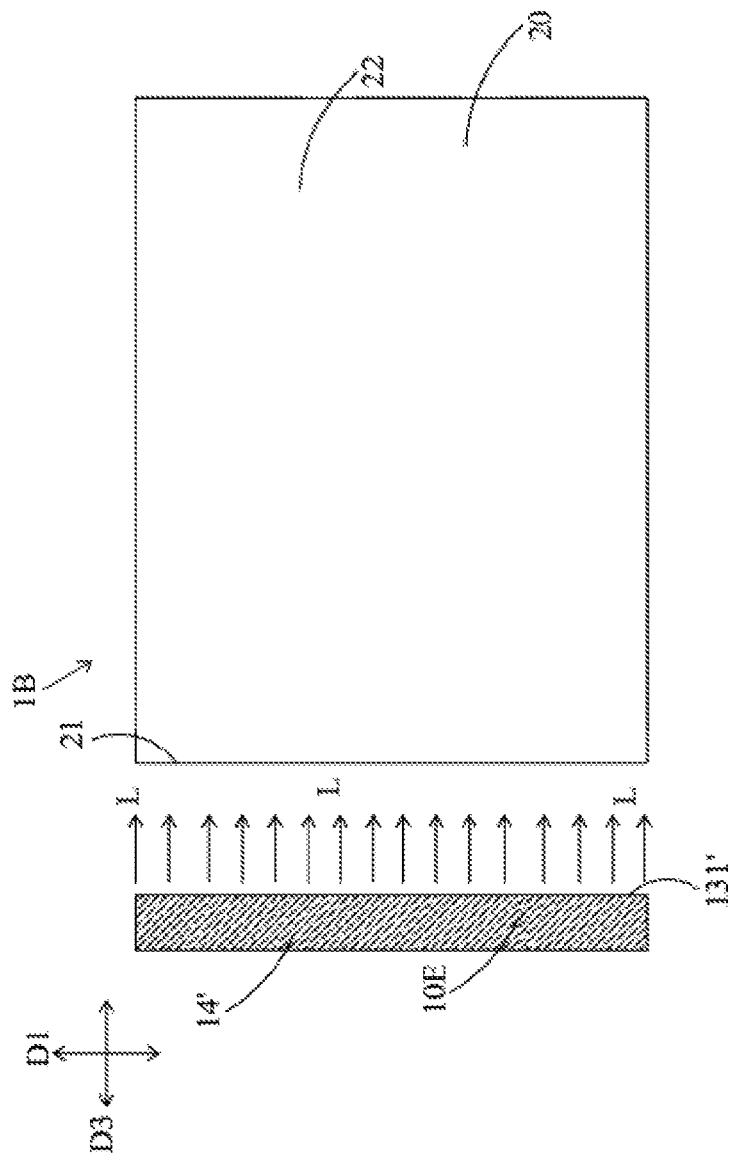

As shown in FIG. 16A and FIG. 16B, the backlight module 1B includes a top-view type linear light-emitting device (taking the linear light-emitting device 10E as an example) and the light guide plate 20 as described above. Along the normal direction $D_3$ of the submount substrate 11 of the linear light-emitting device 10E, the linear light-emitting device 10E is disposed beside the light guide plate 20, and the light-incident surface 21 of the light guide plate 20 is disposed substantially in parallel with and facing the light-emitting top surface 131' of the linear light-emitting device 10E.

Thereby, the light beam L radiated from the light-emitting top surface 131' of the linear light-emitting device 10E can be transmitted to the light-incident surface 21 of the light guide plate 20. Then, the light beam L can be reflected by the reflective layer 24 of the light guide plate 20, and finally be radiated evenly out of the light-exiting surface 22. In addition, the light-emitting top surface 131' of the linear light-emitting device 10E can provide a uniformly distributed linear light beam L. Therefore, among other advantages, the light-incident surface 21 has fewer dark areas, and the light-mixing distance between the light-incident surface 21 and the border of the effective area of the display can be made smaller.

Desirably, the area of the light-emitting top surface 131' of the linear light-emitting device 10E is not larger than the area of the light-incident surface 21 of the light guide plate 20, so that the light beam L can be effectively transmitted to the light guide plate 20 via the light-incident surface 21. In addition, the submount substrate 11 of the linear light-emitting device 10E can be folded as an L shape so that the submount substrate 11 can have a vertical portion and a horizontal portion. The horizontal portion of the L-shaped submount substrate 11 is extended along the normal direction $D_3$ of the vertical portion of the L-shaped submount substrate 11 so that the horizontal section of the substrate-top surface 111 of the submount substrate 11 is extended beyond the light-emitting top surface 131'. A portion of the light guide plate 20 can be overlaid on the horizontal portion of the submount substrate 11 that protrudes beyond the substrate-top surface 111 of the light-emitting top surface 131'. In other words, the submount substrate 11 includes the vertical portion and the horizontal portion such that the substrate-top surface 111 includes a vertical section substrate-top surface and a horizontal section substrate-top surface.

In addition, for the linear light-emitting device 10A or 10E, the reflective structure 14 (or 14') may not cover the third chip-edge surfaces 1233 and the fourth chip-edge surface 1234 of the LED semiconductor chips 12 on the left and right sides of the linear light-emitting device 10A or 10E, so that, along the first horizontal direction $D_1$, the light beam L emitted from the LED semiconductor chips 12 on the left and right sides can be directly emitted by the packaging structure 13 (or 13') and not be constrained by the reflective structure 14 (or 14'). Thus, along the horizontal direction $D_1$, the linear light-emitting device 10A (or 10E) can provide a light beam of a larger viewing angle.

In summary for some embodiments, the chip-scale linear light-emitting device can provide a uniformly distributed linear light beam to reduce or improve the phenomenon of dark regions near the light-incident surface of the light guide plate. In addition, the chip-scale linear light-emitting device can be a side-view type, and it can also be a top-view type, both of which can be used with an ultra-thin light guide plate to reduce the overall thickness of the backlight module.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A linear light-emitting device comprising:
   a submount substrate comprising a substrate-top surface, wherein a first horizontal direction and a second horizontal direction perpendicular to each other are defined on the substrate-top surface;
   a plurality of LED semiconductor chips disposed on the substrate-top surface of the submount substrate along the first horizontal direction, wherein each of the LED semiconductor chips includes a chip-upper surface, a chip-lower surface opposite to the chip-upper surface, a first chip-edge surface, a second chip-edge surface, and a set of electrodes, wherein the first chip-edge surface and the second chip-edge surface are disposed in parallel and spaced apart along the second horizontal direction and are connected to each of the chip-upper surface and the chip-lower surface, and the set of electrodes is disposed on the chip-lower surface;
   a chip-scale packaging structure disposed on the substrate-top surface of the submount substrate and covering the second chip-edge surfaces of the LED semiconductor chips, wherein the chip-scale packaging structure includes a photoluminescent element covering the second chip-edge surfaces of the LED semiconductor chips, and comprises a package-top surface and a continuous main light-emitting side surface, wherein the continuous main light-emitting side surface and the second chip-edge surfaces of the LED semiconductor chips are disposed in parallel and are spaced apart from each other along the second horizontal direction and are perpendicular to the set of electrodes, and wherein the photoluminescent element is configured to cause light from the LED semiconductor chips to be emitted with a linearly and uniformly distributed light radiation pattern across the continuous main light-emitting side surface;
   a reflective structure disposed on the substrate-top surface of the submount substrate, and covering the first chip-edge surfaces of the LED semiconductor chips, the chip-upper surfaces of the LED semiconductor chips, and the package-top surface of the chip-scale packaging structure, but exposing the continuous main light-emitting side surface of the chip-scale packaging structure and the second chip-edge surfaces of the LED semiconductor chips.

2. The linear light-emitting device of claim 1, wherein the photoluminescent element further directly covers the chip-upper surfaces of the LED semiconductor chips.

3. The linear light-emitting device of claim 1, wherein the chip-scale packaging structure further comprises a light-transmitting element, the light-transmitting element directly covers the second chip-edge surfaces the LED semiconductor chips, and the photoluminescent element directly covers one side surface of the light-transmitting element and indirectly covers the second chip-edge surfaces of the LED semiconductor chips; wherein the side surface of the light-transmitting element and the second chip-edge surfaces of the LED semiconductor chips are disposed in parallel and are spaced apart along the second horizontal direction.

4. The linear light-emitting device of claim 3, wherein the photoluminescent element directly covers the chip-upper surface of the LED semiconductor chips.

5. The linear light-emitting device of any one of claims 1 and 3, wherein the reflecting structure directly covers the chip-upper surfaces of the LED semiconductor chips.

6. The linear light-emitting device of claim 1, wherein each of the LED semiconductor chips further comprises a third chip-edge surface and a fourth chip-edge surface, the third chip-edge surface and the fourth chip-edge surface are disposed in parallel between the chip-upper surface and the chip-lower surface and are spaced apart along the first horizontal direction; wherein the reflective structure directly covers the third chip-edge surfaces and the fourth chip-edge surfaces of the LED semiconductor chips, and directly covers the first chip-edge surfaces of the LED semiconductor chips.

7. The linear light-emitting device of any one of claims 1 to 4, wherein the chip-scale packaging structure or the reflective structure directly covers the first chip-edge surfaces of the LED semiconductor chips.

8. The linear light-emitting device of any one of claims 1 to 4, further comprising a reflective layer disposed on the substrate-top surface of the submount substrate, wherein the chip-scale packaging structure is disposed on the reflective layer.

9. A backlight module comprising:
the linear light-emitting device of any one of claims 1 to 4; and
a light guide plate comprising a light-incident surface, a light-exiting surface, a light-guide-back surface and a reflective layer, wherein the light-incident surface is disposed facing the continuous main light-emitting side surface of the linear light-emitting device, and is connected to the light-exiting surface and the light-guide-back surface, wherein the reflective layer is disposed on the light-guide-back surface.

10. The backlight module of claim 9, wherein the light guide plate is disposed on the substrate-top surface of the submount substrate of the linear light-emitting device.

11. The backlight module of claim 9, wherein an area of the continuous main light-emitting side surface is not larger than an area of the light-incident surface of the light guide plate.

12. The linear light-emitting device of claim 1, wherein the second chip-edge surfaces of the LED semiconductor chips are light-emitting such that the photoluminescent element is configured to cause light from the second chip-edge surfaces of the LED semiconductor chips to be emitted with a linearly and uniformly distributed light radiation pattern across the continuous main light-emitting side surface.

13. The linear light-emitting device of claim 1, wherein the set of electrodes include both positive and negative electrodes for providing electrical energy to the LED semiconductor chips.

14. A linear light-emitting device comprising:
a submount substrate comprising a substrate-top surface, wherein a first horizontal direction, a second horizontal direction and a normal direction perpendicular to each other are defined on the substrate-top surface;
a plurality of LED semiconductor chips disposed on the substrate-top surface of the submount substrate along the first horizontal direction, wherein each of the LED semiconductor chips includes a chip-upper surface, a chip-lower surface opposite to the chip-upper surface, a plurality of chip-edge surfaces, and a set of electrodes, wherein the chip-edge surfaces are connected to the chip-upper surface and the chip-lower surface, and the set of electrodes is disposed on the chip-lower surface;
a chip-scale packaging structure disposed on the substrate-top surface of the submount substrate and covering the chip-upper surfaces and/or the chip-edge surfaces of the LED semiconductor chips, wherein the chip-scale packaging structure includes a light-transmitting element and a photoluminescent element, the light-transmitting element directly covers the chip-edge surfaces of the LED semiconductor chips, and the photoluminescent element covers the chip-upper surfaces of the LED semiconductor chips, and includes a continuous main light-emitting top surface and a plurality of package-side surfaces, the continuous main light-emitting top surface of the chip-scale packaging structure and the chip-upper surfaces of the LED semiconductor chips are disposed in parallel along the normal direction and are spaced apart from each other and are parallel to the set of electrodes; and
a reflective structure disposed on the substrate-top surface of the submount substrate, and covering the package-side surfaces of the chip-scale packaging structure and the chip-edge surfaces of the LED semiconductor chips along the first horizontal direction and the second horizontal direction, but exposing the continuous main light-emitting top surface of the chip-scale packaging structure and the chip-upper surface of the LED semiconductor chips.

15. The linear light-emitting device of claim 14, wherein the photoluminescent structure comprises a photoluminescent layer, the photoluminescent layer being disposed on the chip-upper surfaces of the LED semiconductor chips.

16. The linear light-emitting device of any one of claims 14 and 15, further comprising a reflective layer disposed on the substrate-top surface of the submount substrate, wherein the chip-scale packaging structure is disposed on the reflective layer.

17. A backlight module comprising:
the linear light-emitting device of any one of claims 14 and 15; and
a light guide plate comprising a light-incident surface, a light-exiting surface, a light-guide-back surface and a reflective layer, wherein the light-incident surface is disposed facing the continuous main light-emitting top surface of the linear light-emitting device, and is connected to the light-exiting surface and the light-guide-back surface, wherein the reflective layer is disposed on the light-guide-back surface.

18. The backlight module of claim 17, wherein the substrate-top surface of the submount substrate comprises a vertical section and a horizontal section, and the light guide plate is disposed on the horizontal section of the submount substrate.

19. The backlight module of claim 17, wherein an area of the continuous main light-emitting top surface is not larger than an area of the light-incident surface of the light guide plate.

* * * * *